(12) United States Patent
Chojnacki et al.

(10) Patent No.: US 6,674,434 B1
(45) Date of Patent: Jan. 6, 2004

(54) METHOD AND SYSTEM FOR AUTOMATIC GENERATION OF SHAPE AND CURVATURE DATA FOR A GEOGRAPHIC DATABASE

(75) Inventors: Robert Chojnacki, Chicago, IL (US); Jerry Feigen, Chicago, IL (US); A. Merri Boylan, Lemont, IL (US)

(73) Assignee: Navigation Technologies Corp., Chicago, IL (US)

( * ) Notice: Subject to any disclaimer, the term of this patent is extended or adjusted under 35 U.S.C. 154(b) by 0 days.

(21) Appl. No.: 09/426,036

(22) Filed: Oct. 25, 1999

(51) Int. Cl.[7] .............................................. G06T 17/00
(52) U.S. Cl. ...................................... 345/428; 701/212
(58) Field of Search ................................ 345/428, 751, 345/442; 701/200, 201, 212, 208, 209, 210, 213

(56) References Cited

U.S. PATENT DOCUMENTS

| | | | |
|---|---|---|---|
| 5,214,757 A | 5/1993 | Mauney et al. | 345/751 |
| 5,438,517 A | 8/1995 | Sennott et al. | 364/449 |
| 5,524,202 A | 6/1996 | Yokohama | 707/104.1 |
| 5,559,938 A * | 9/1996 | Van Roekel et al. | 345/441 |
| 5,566,288 A | 10/1996 | Koerhsen | 395/142 |
| 5,633,946 A | 5/1997 | Lachinski et al. | 382/103 |
| 5,815,161 A * | 9/1998 | Emmerink et al. | 345/440 |
| 5,848,375 A | 12/1998 | Nunobiki et al. | 701/212 |
| 5,945,976 A * | 8/1999 | Iwamura et al. | 345/139 |
| 6,035,253 A * | 3/2000 | Hayashi et al. | 701/211 |
| 6,173,277 B1 * | 1/2001 | Asby et al. | 707/1 |
| 6,268,825 B1 * | 7/2001 | Okada | 342/357.13 |
| 6,370,475 B1 * | 4/2002 | Breed et al. | 701/301 |

FOREIGN PATENT DOCUMENTS

| | | | |
|---|---|---|---|
| EP | 0 807 803 A2 | 5/1997 | |
| EP | 0 890 823 A2 | 6/1998 | |
| EP | 0921509 | 6/1999 | G08G/1/01 |
| WO | WO9854682 | 12/1998 | G08G/1/127 |

* cited by examiner

*Primary Examiner*—Mark Zimmerman
*Assistant Examiner*—Huedung X. Cao
(74) *Attorney, Agent, or Firm*—Frank J. Kozak; Jon D. Shutter; Lawrence M. Kaplan

(57) ABSTRACT

A process and system for collecting data about roads located in a geographic area and using the collected data to develop representations of the locations and geometry of the roads for a geographic database. A vehicle in which data acquisition equipment is installed is driven on the roads. Using the data acquisition equipment, data are collected representing positions of the vehicle as it is being driven along the roads and data indicating the path of the vehicle as it is being driven along the roads. The data acquired while traveling may be smoothed and fused. The data acquired while traveling are processed by a program that automatically selects which of the data are necessary to provide a specified level of accuracy in a geographic database that includes data that represent the roads including data that represent positions and geometry of the roads. The data selected by the program are stored in the geographic database.

17 Claims, 21 Drawing Sheets

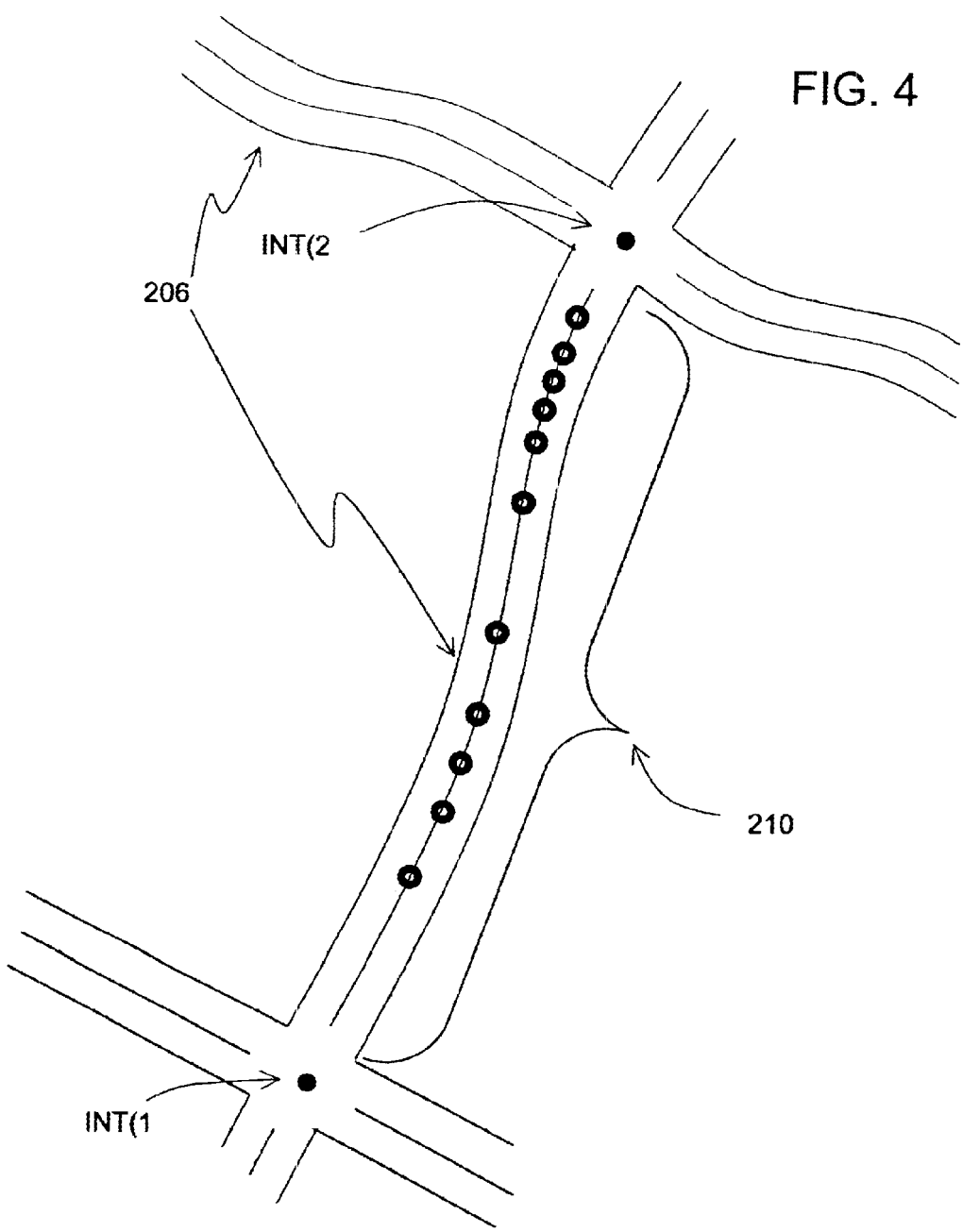
FIG. 4
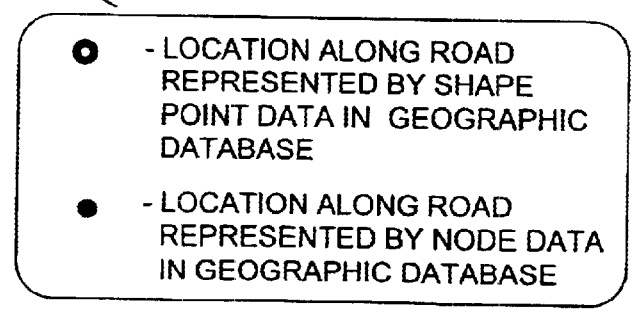

- LOCATION ALONG ROAD REPRESENTED BY SHAPE POINT DATA IN GEOGRAPHIC DATABASE

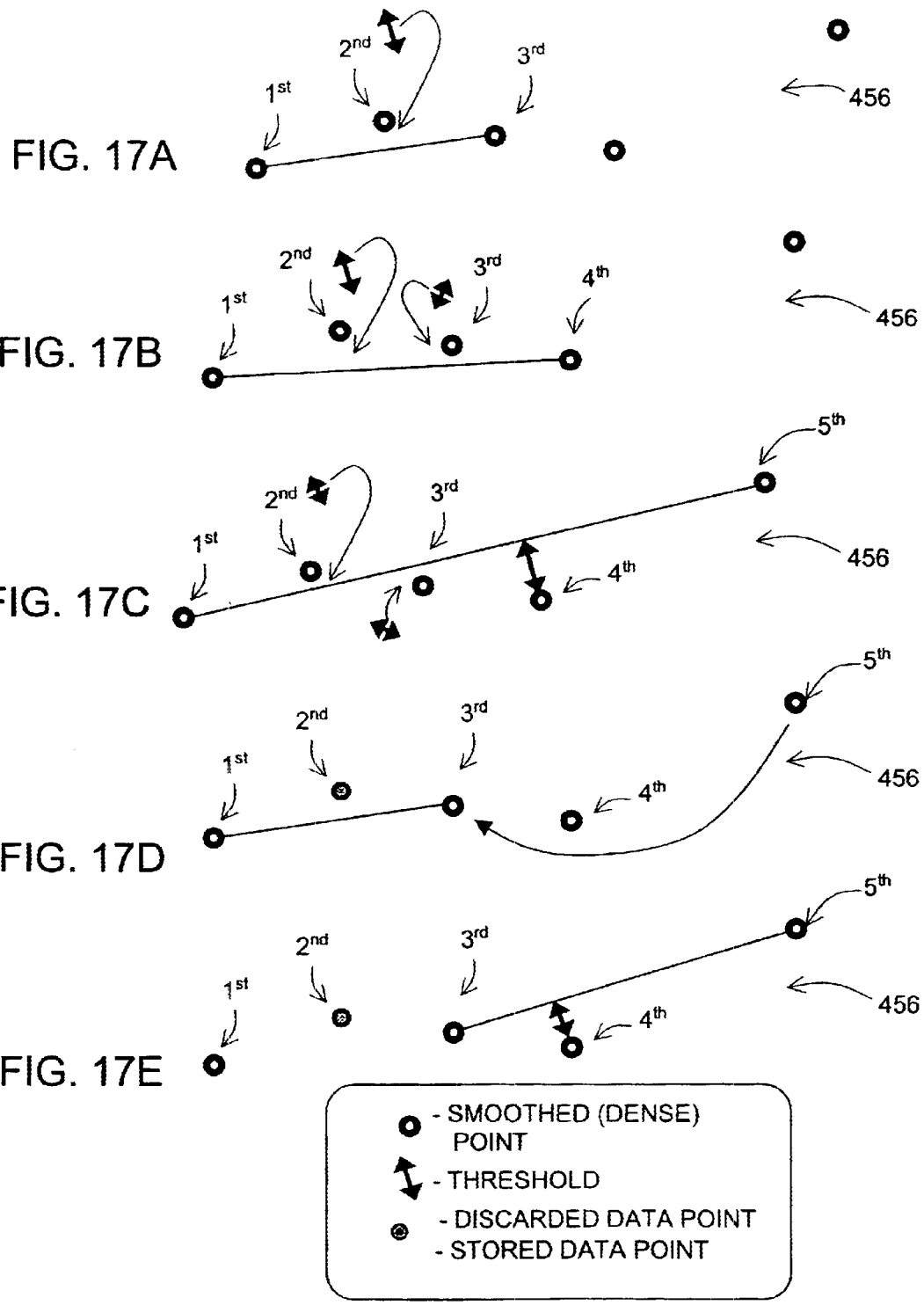

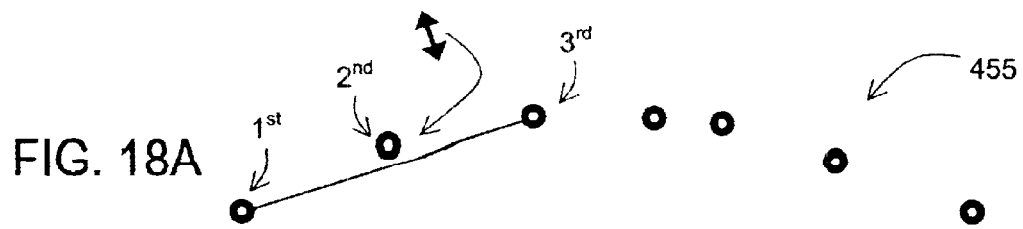
FIG. 18A
FIG. 18B
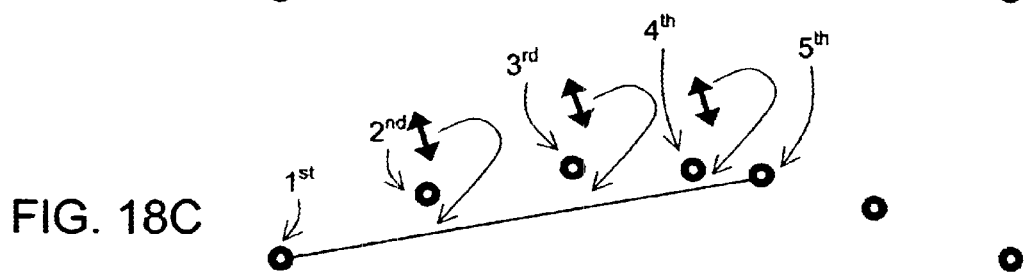
FIG. 18C
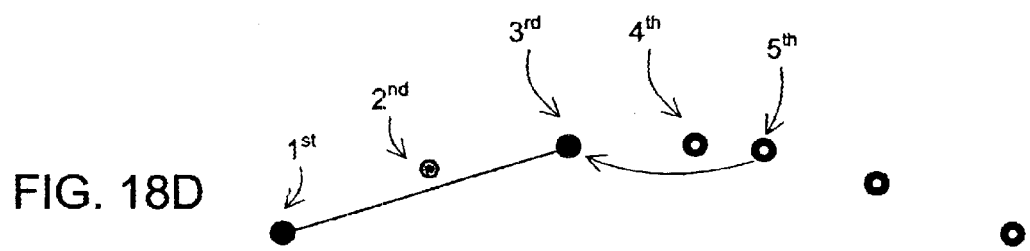
FIG. 18D
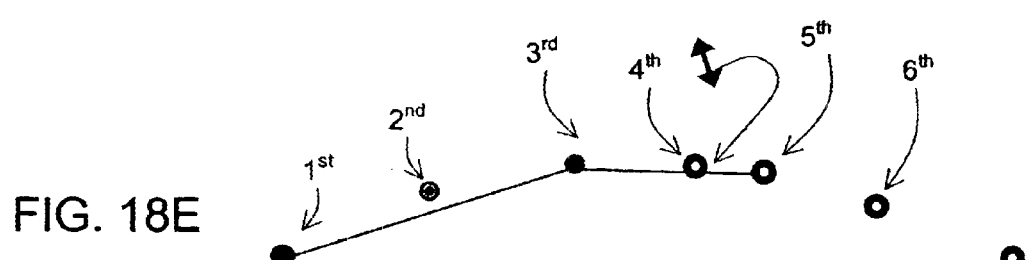
FIG. 18E
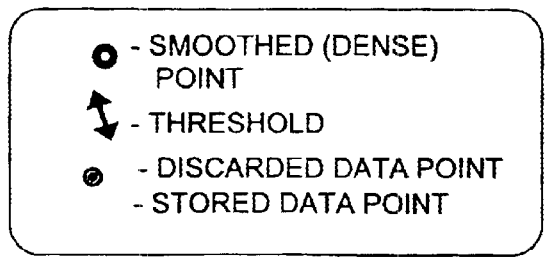

METHOD AND SYSTEM FOR AUTOMATIC GENERATION OF SHAPE AND CURVATURE DATA FOR A GEOGRAPHIC DATABASE

REFERENCE TO RELATED APPLICATION

The present application Ser. No. 09/426,341 is related to the application entitled "METHOD AND SYSTEM FOR AUTOMATIC CENTERLINE ADJUSTMENT OF SHAPE POINT DATA FOR A GEOGRAPHIC DATABASE" filed on even date herewith, the entire disclosure of which is incorporated by reference herein.

BACKGROUND OF THE INVENTION

The present invention relates to a process and system for collecting data about roads located in a geographic area and using the collected data to develop representations of the positions and shapes of the roads for a geographic database.

Geographic databases have various uses. Geographic databases are used in in-vehicle navigation systems, personal computers, networked computing environments, and various other kinds of platforms, as well as Internet applications. Geographic databases are used with various kinds of applications to provide many different functions, including map display, route calculation, route guidance, truck fleet deployment, traffic control, electronic yellow pages, emergency services, and so on. Geographic databases are also used with various types of drivers' assistance features such as obstacle warning and avoidance, curve warning, advanced cruise control, headlight aiming, and so on.

In order to provide these kinds of functions, a geographic database includes data that represent physical features in a covered geographic region. Physical features that are represented by geographic databases include roads, points of interests, railroad tracks, bodies of water, intersections, and so on. With respect to navigable roads, geographic databases may include data about the various characteristics of the represented roads, such as the geographic coordinates of roads, speed limits along road segments, locations of stop lights, turn restrictions at intersections of roads, address ranges, street names, and so on. Geographic databases may also include information about points of interest in covered regions. Points of interest may include restaurants, hotels, airports, gas stations, stadiums, police stations, and so on.

Collecting information for a geographic database is a significant task. Not only is the initial collection of information a significant undertaking, but a geographic database needs to be updated on a regular basis. For example, new streets are constructed, street names change, traffic lights are installed, and turn restrictions are added to existing roads. Also, new levels of detail may be added about geographic features that are already represented in an existing geographic database. For example, existing data about roads in a geographic database may be enhanced with information about lane widths, shoulder sizes, lane barriers, address ranges, sidewalks, bicycles paths, etc. Thus, there exists a need to continue to collect information for a geographic database.

Included among the most important types of data in a geographic database are the positions and geometry (i.e., shapes) of roads. Using a GPS system, a person can determine his/her geographic coordinates on the surface of the earth. However, in order for the person to know what road he/she is on, it is required to know the geographic coordinates of the roads around the person in order to relate the person's geographic coordinates to the geographic coordinates of the roads.

How a geographic database represents the positions and geometry of roads is an important consideration that can affect the usefulness of the geographic database. The manner in which roads are represented in a geographic database can affect the kinds of applications that can use the data in the geographic database.

Geographic databases represent positions of roads by identifying the geographic coordinates of points along the roads. According to a prior method, a geographic database developer-technician performed the step of selecting points along a road to be used to represent the road in a geographic database. The geographic database developer-technician viewed an image of the road and, while viewing the image, estimated the locations of points from the image to use to represent the road.

The image of the road that was viewed by the database developer-technician could be obtained by various means. One way to obtain an image of the road was to use aerial photographs of the roads. Another way to obtain an image of the road is to view a trace of GPS data acquired while driving along the road. Still another way to obtain an image of the road was to use ground-based photographs. Regardless of the means by which the image of the road was obtained, the geographic database developer-technician selected points from the image of the road and the geographic coordinates of these points were used to represent the road in the geographic database. For straight road segments, the database developer-technician identified the geographic coordinates of the intersections at each end of the straight road segment. For a curved road segment, the database developer-technician selected one or more points along the curved portion of the road segment to approximate the location of the road.

Although this process worked well, there is room for improvement. Aerial photographs, as well as other images from which points along roads could be selected, provide only a limited amount of detail. In addition, aerial photographs and other kinds of images of roads are useful for acquiring only certain kinds data about geographic features. For example, aerial photographs of roads are not useful for identifying the locations of road signs or address ranges along the roads. Thus, if an aerial photograph is used to determine the geographic coordinates of locations on roads, it is still necessary for a geographic database developer-technician to physically travel along the road segments shown on the aerial photograph to acquire data about the features that cannot be discerned from the aerial photograph. This increases the cost of acquiring information for a geographic database. Similar limitations are associated with images obtained by other means.

Another area in which there is room for improvement relates to consistency. When an image of a road is used to determine points along the road to represent the road, the selection of points depends to some extent upon the judgment of the geographic database developer-technician. Therefore, the points chosen to represent a road may not be consistent between different geographic database developer technicians. This is especially the case for curved portions of roads.

Accordingly, there exists a need for an improved process to collect data about the locations of physical features for a geographic database. In addition, there exists a need for an improved process and/or system to collect data about positions and shapes of roads and use the collected data to represent the roads in a geographic database.

SUMMARY OF THE INVENTION

To address these and other objectives, the present invention comprises a process and system for collecting data about roads located in a geographic area and using the collected data to develop representations of the positions and geometry of the roads for a geographic database. The data are collected using equipment installed in a vehicle that is driven on the roads. The data that are collected may represent different properties of the roads. The data that are collected may include data that represent the vehicle's approximate positions (i.e., geographic coordinates) along the roads at particular times. The data that are collected also may include data representing the vehicle's acceleration and speed at particular times. The data collected while traveling may be fused and smoothed. The data collected while traveling are processed by a program that automatically selects which of the data are necessary to provide a specified level of accuracy in a geographic database that includes data that represent the roads including data that represent positions and/or geometry of the roads. The data selected by the program are stored in the geographic database.

BRIEF DESCRIPTION OF THE DRAWINGS

FIG. 4 is an illustration of a portion of a road in the geographic area shown in FIG. 3.

FIGS. 17A–17E illustrate an alternative process for automatically generating shape points for a geographic database.

FIGS. 18A–18E show application of another alternative process for automatically generating shape points for a geographic database.

DETAILED DESCRIPTION OF THE PRESENTLY PREFERRED EMBODIMENTS

I. OVERVIEW

Figure 1:
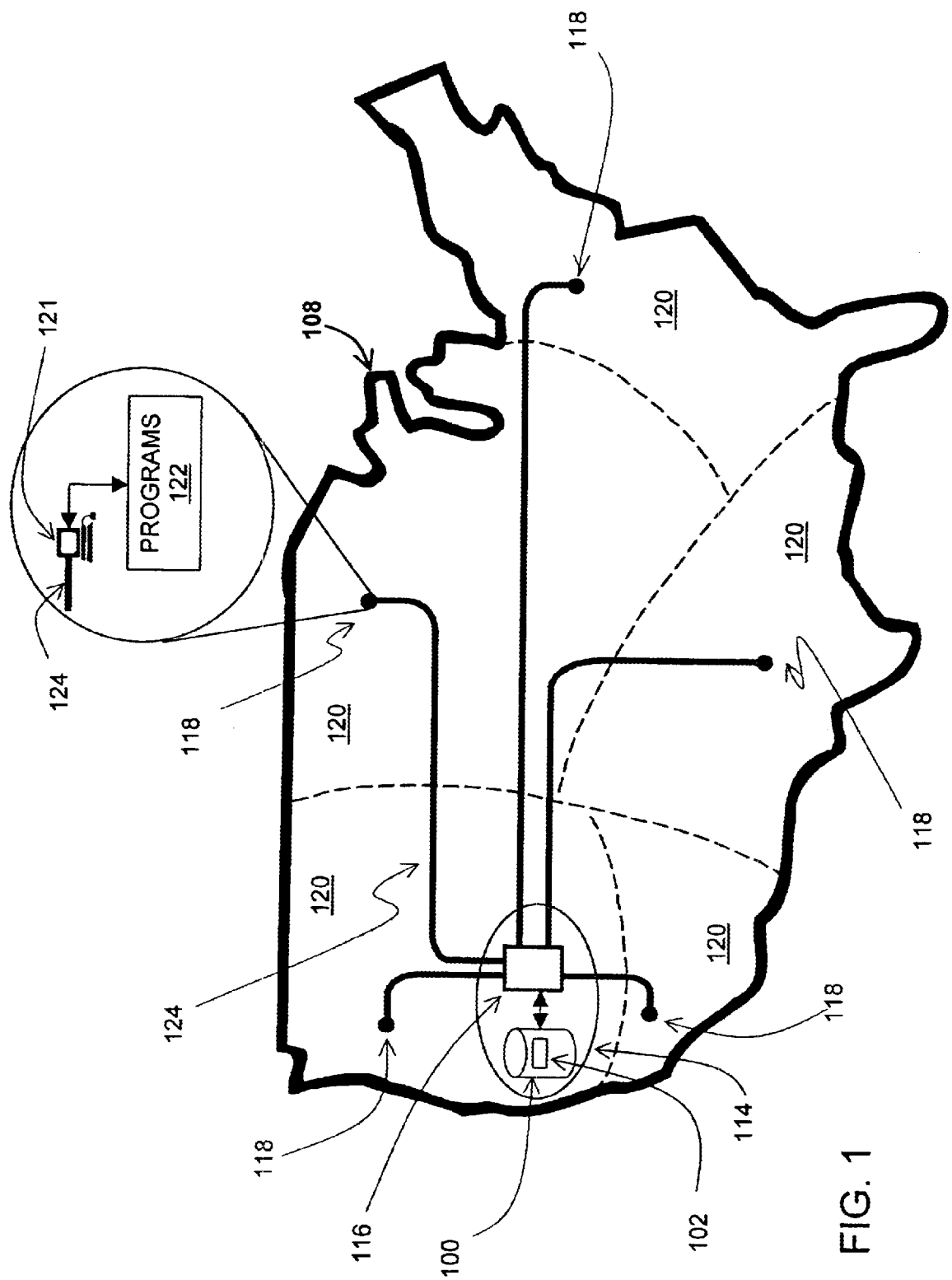
FIG. 1 is a diagram illustrating a coverage area in which an embodiment of the present invention for collecting data for a geographic database can be used.

A first embodiment is described with reference to FIGS. 1 through 20D. FIG. 1 shows a primary copy 100 of a geographic database. The primary copy 100 of the geographic database includes data 102 that represent geographic features in a coverage area 108. The coverage area 108 may correspond to an entire country, such as the United States. Alternatively, the primary copy 100 of the geographic database may correspond to several countries, such as the United States, Canada, and Mexico, or France, Germany, and Italy, and so on. According to another alternative, the primary copy 100 may represent only a single region within a country, such as the West Coast or the Midwest of the United States. The primary copy 100 of the geographic database is maintained as the copy or version that has the most up-to-date data relating to the coverage area 108. Although the primary copy 100 of the geographic database includes data that represent geographic features in the entire coverage area 108, there may be parts of the coverage area 108 that contain geographic features that are not represented by data in the geographic database, or for which the coverage is sparse.

As stated above, the data 102 in the primary copy 100 of the geographic database represents geographic features in the covered area 108. The data 102 includes various attributes of the represented geographic features. For example, included in the primary copy 100 of the geographic database are data that represent roads and data that represent attributes of roads, such as the geographic coordinates of positions on the roads, the curvature at points along the roads, the street names of the roads, the addresses ranges along the roads, turn restrictions at intersections of roads, and so on. The geographic data 102 may also include information about points of interest in the covered area 108. Points of interest may include hotels, restaurants, museums, stadiums, offices, automobile dealerships, auto repair shops, etc. The geographic data 102 may include data about the locations of these points of interests. The geographic data 102 may also include information about places, such as cities, towns, or other communities. The geographic data 102 may include other kinds of information.

The primary copy 100 of the geographic database is updated, expanded, and/or otherwise modified on a regular and continuing basis. The primary copy 100 of the geographic database is physically located at a first location 114.

In one embodiment, the primary copy 100 of the geographic database is stored on one or more hard drives and accessed with a mainframe computer 116, such as an Amdahl or IBM mainframe computer. One or more backup copies are also maintained.

In one embodiment, the geographic data 102 are maintained and developed by Navigation Technologies Corporation of Rosemont, Ill. However, it is understood that the inventive concepts disclosed herein are not restricted to any particular source of data.

Figure 2:
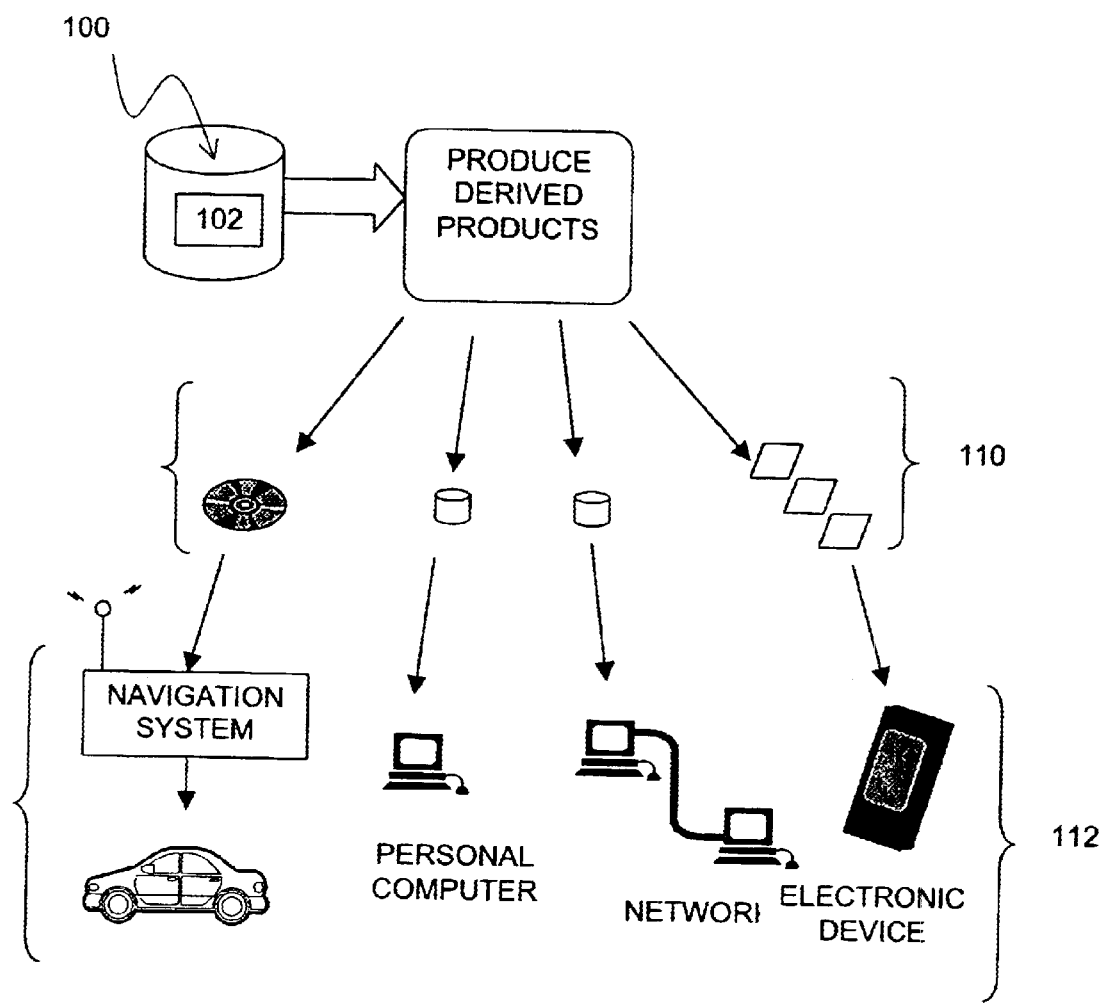
FIG. 2 is a diagram illustrating a process for forming derived database products from the primary version of the geographic database shown in FIG. 1.

As illustrated in FIG. 2, the primary copy 100 of the geographic database is used to make derived database products 110. The derived database products 110 made from the primary copy 100 may include only portions of all the data in the primary copy 100. For example, the derived database products 110 may include data that relate to only one or more specific regions located within the coverage area 108 of the primary copy 100.

The derived database products 110 are used by various applications. For example, the derived database products 110 may be used for navigation-related applications, such as route calculation, route guidance, vehicle positioning, and map display. The derived database products 110 may also be used by applications that provide vehicle safety or control functions, such as obstacle avoidance, automatic cruise control, accident avoidance, automatic curve detection, automatic headlight aiming, and so on. The derived database products 110 may also be used for other kinds of functions, such as electronic yellow pages, etc.

The derived database products 110 may be used on various kinds of computing platforms 112. For example, the derived database products 110 may be used in navigation systems (such as in-vehicle navigation systems and hand-held portable navigation systems), personal computers (including desktop and notebook computers), and other kinds of devices (such as PalmPilot®-type devices, pagers, telephones, personal digital assistants, and so on). Derived database products 110 may also be used on networked computing platforms and environments, including the Internet.

The derived database products 110 made from the primary copy 100 may be in a format which is different from the format in which the primary copy 100 of the database is maintained. The derived database products 110 may be in a format that facilitates the uses of the derived products on the platforms in which they are installed. The derived database products 110 may also be stored in a compressed format on the media on which they are located.

The derived database products 110 may be stored on media that are suitable for the hardware platforms in which they are installed. For example, the derived database products may be stored on CD-ROM disks, hard drives, DVD disks, flash memory, or other types of media that are available now or that become available in the future.

As mentioned previously, the primary copy 100 of the geographic database includes the most up-to-date data relating to the coverage area 108. Processes are used to update, check, and expand the coverage of the data 102 in the primary copy 100 of the geographic database on a regular basis. Expanding the coverage of the database includes adding data records to represent geographic features that had not already been represented by records in the geographic database. For example, within a coverage area (such as the area 108 in FIG. 1), there may be sub-areas that are not represented. Expanding the coverage of the database also includes adding data for new developments, e.g., new sub-divisions. Expanding the coverage may also include adding more detail for areas or features that are already represented. In addition to expanding the coverage of the geographic database, there is a continuous need to update and check the existing data in the database. For example, speed limits may change, turn restrictions may change, etc.

Referring again to FIG. 1, the processes of updating, checking and expanding the database are performed by staff at one or more field offices 118. The field offices 118 are located in the geographic area corresponding to the coverage area 108 of the primary copy 100 of the geographic database. Each field office 118 may be associated with a separate portion 120 of the entire coverage area 108. Each field office 118 includes the appropriate computing equipment, including hardware and software, so that data can be exchanged between the field office and the main computer 116. For example, each field office 118 may include one or more workstation computers 121 upon which are installed various programs 122. Included among these programs 122 are programs for processing and manipulating raw data collected by researchers while out in the field, programs for communicating with the main computer 116 in order to access the primary copy of the geographic database, and programs for adding or modifying data in the primary copy of the geographic database as part of an updating process. In one embodiment, the field offices 118 and the main computer 116 are connected with a data network 124. The network 124 may be a wide area network (WAN), the Internet, or any other kind of technology that enables the exchange of data between the main computer 116 and the field offices 118.

Each of the field offices 118 is staffed with one or more technicians (referred to herein as "researchers"). The researchers perform several functions. The researchers collect data for the primary copy 100 of the geographic database. The researchers may add data about geographic features that had not previously been included in the primary copy 100 of the geographic database. The researchers may also check data about geographic features that are already represented in the primary copy 100 of the database to assure that the data are correct and up-to-date.

Figure 3:
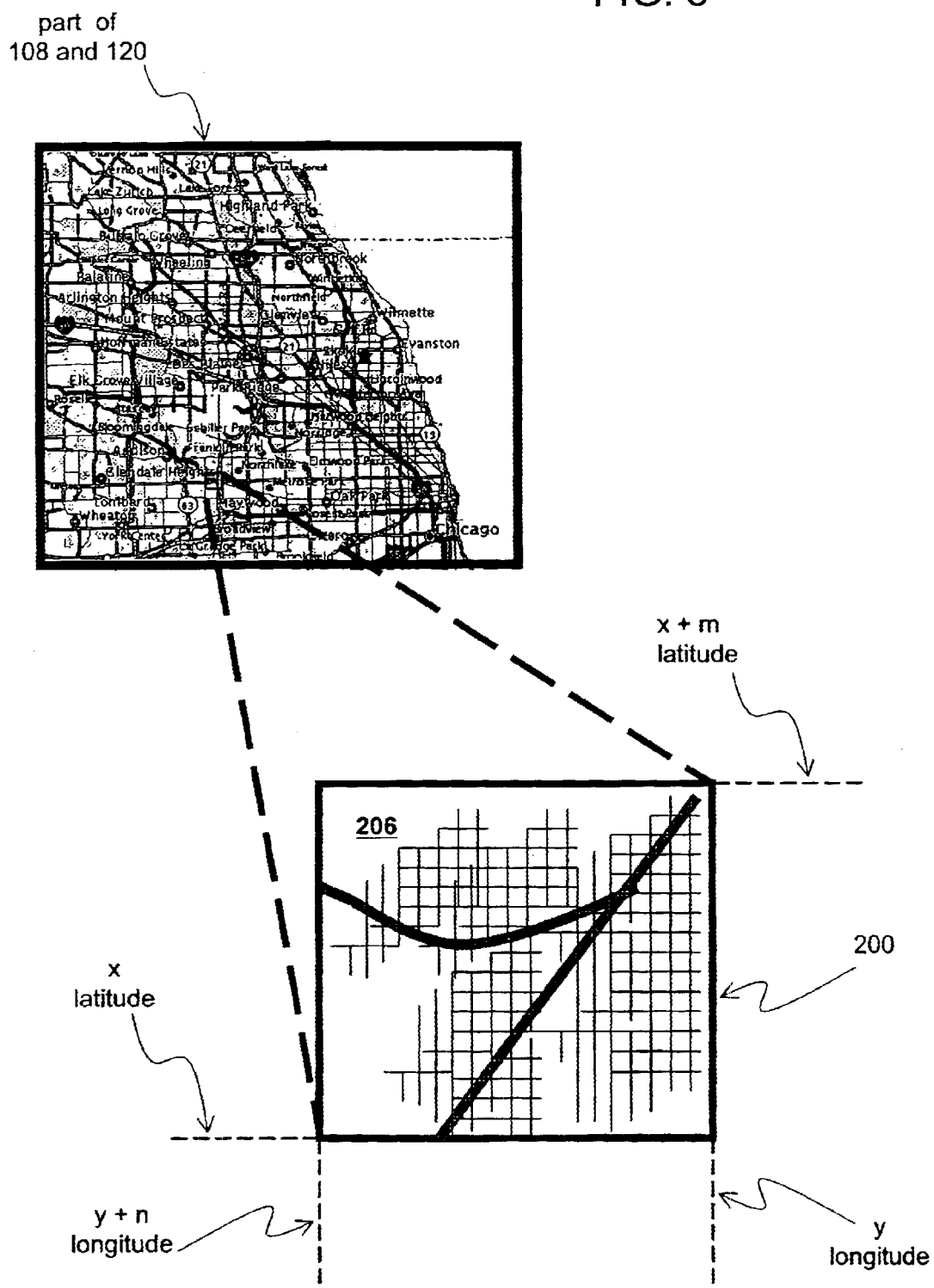
FIG. 3 is map illustrating an assignment area which is located in the coverage area shown in FIG. 1 and which contains geographic features about which data will be collected for the primary version of the geographic database.

The data collection activities of a researcher are organized into assignments. Referring to FIG. 3, each assignment is associated with an assignment area 200. The assignment area 200 is a physical geographic area that contains geographic features about which the researcher collects data for updating or expanding the primary copy 100 of the geographic database. Included among the geographic features about which the researcher collects data is the road network. FIG. 3 illustrates a portion of the road network 206 in the coverage area 108.

The assignment area 200 is typically a relatively small portion of the coverage area 108. The assignment area 200 may be within the part 120 of the coverage area assigned to the field office. The size of the assignment area 200 may depend upon various factors, such as the kinds of data being collected, the distance of the assignment area from the field office, the density of geographic features in the assignment area, and so on. For example, the assignment area 200 may be several square miles, or alternatively the assignment area 200 may be hundreds of square miles.

Although data about some types of geographic features can be collected without leaving the location of the field office (using aerial photographs, as mentioned above), collection of data for other types of geographic features may require that the researcher physically observe the geographic feature. Thus, a researcher may have to travel to the assignment area to collect some types of data.

II. THE GEOGRAPHIC DATABASE

The geographic database 100 (in FIG. 1) contains various kinds of information about roads and other features in the covered region. One important kind of information contained in the geographic database is data defining the locations of roads. Locations of roads may be represented in a geographic database in various different ways. One way to represent a location of a road is to include geographic coordinates of positions along the represented road. This type of representation is described in connection with FIGS. 4, 5 and 6.

Figure 5:
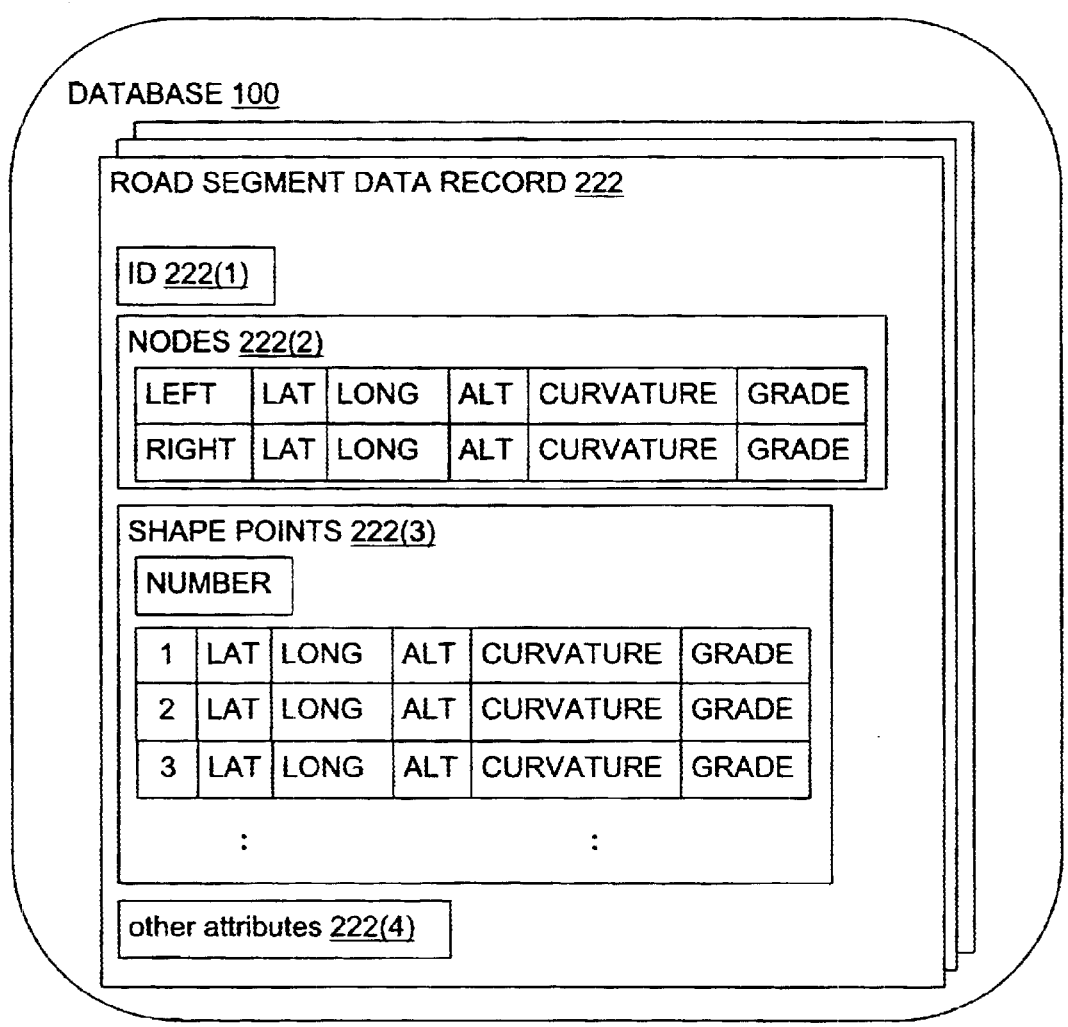
FIG. 5 is a block diagram showing components of a data record in the geographic database used to represent the road shown in FIG. 4.

FIG. 4 illustrates one road segment 210 which is part of the road network 206 shown in FIG. 3. The road segment 210 extends between an intersection INT(1) and an intersection INT(2). In FIG. 5, the geographic database 100 includes a data record 222 that represents the road segment 210. The data record 222 may include a record ID 222(1). Stored with the data record 222 that represents the road segment 210 is data 222(2) identifying the geographic coordinates (e.g., latitude, longitude, and optionally altitude, grade, curvature) of the left and right nodes located at the endpoints of the road segment. With respect to the road segment 210, the geographic coordinates of the left node correspond to the geographic coordinates of the intersection INT(1) and the geographic coordinates of the right node correspond to the geographic coordinates of the intersection INT(2). The geographic coordinates that are stored for the node data 222(2) may be expressed as absolute coordinates or relative coordinates.

For some applications, it is important to know the location (s) of a road segment between its endpoints. If a road segment is straight (in two dimensions if the geographic database includes only latitude and longitude and in three dimensions if the geographic database includes latitude, longitude, and altitude), the locations of all points along the road segment can be determined by calculating a straight line between the geographic coordinates of the nodes at the endpoints of the road segment. However, if the road segment is other-than-straight (such as the road segment 210 in FIG. 4), additional data are needed to determine the location of a point along the road segment. According to one embodiment, shape point data are used for this purpose.

Referring to FIG. 5, shape point data 222(3) are stored in the data record 222 that represents the road segment 210. The shape point data 222(3) include one or more entries. Each entry in the shape point data 222(3) contains data indicating the geographic coordinates (e.g., latitude and longitude), and optionally additional data, such as altitude, curvature, and road grade, of a separate shape point along the road segment. (The geographic coordinates, altitude, curvature, and road grade stored for shape point data entry 222(3) may be absolute values or relative values.) A shape point is a location along a road segment between its endpoints. In FIG. 4, shape points are shown located between the endpoints of the road segment 210. For each of the shape points shown in FIG. 4, an entry is stored in the shape point data 222(3) stored in the record that represents the road segment 210 in the geographic database 100.

In the embodiment described in connection with FIGS. 4 and 5, the data record 222 that represents the road segment 210 includes shape point data identifying points located along a centerline of the represented road segment. There are alternative ways in which the shape of a road segment may be represented. The manner in which a road is represented may be related to the geometry of the road. For example, if the road is divided by a median, separate sets of shape point data and node data may be used to represent the separate groupings of lanes on each side of the median.

Figure 6:
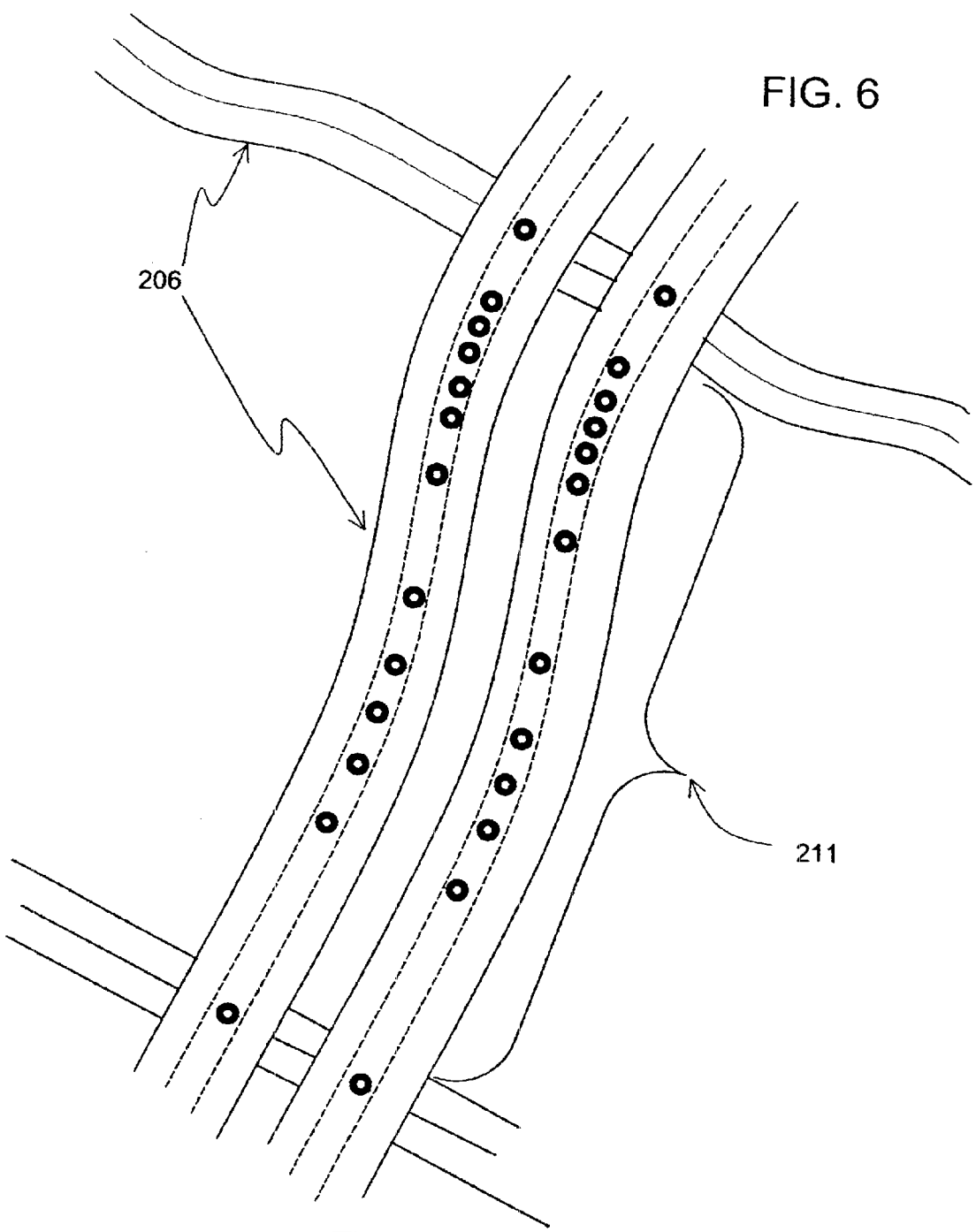
FIG. 6 is an illustration of a portion of another portion of a road in the geographic area shown in FIG. 3.

An example of a road divided by a median is shown in FIG. 6. As shown in FIG. 6, a road segment 211 has lanes divided by a median. In FIG. 6, a separate set of shape points is associated with the grouping of lanes on each side of the median. A database record (similar to record 222 shown in FIG. 5) that represents the road segment in FIG. 6 includes separate sets of shape point data for the shape points on each side of the median. If the lanes on each side of a median are represented by separate sets of shape point data, the shape points for each grouping of lanes may be located along the centerline of the grouping of lanes to which they are associated. In the example shown in FIG. 6, there are three lanes on each side of the median. The shape points for the road segment 211 are located along the center of the middle lane on each side of the median.

It can be appreciated that storing shape point data can take a significant amount of data storage capacity. Various means of data compression may be used to minimize the size of the amount of data that has to be stored.

III. DATA COLLECTION SYSTEM

The data used in the geographic database 100 to represent the positions of roads and other geographic features are the result of several processes. According to an embodiment shown in FIG. 7, these processes include collection processes 300 and shape point formation processes 301. These processes, 300 and 301, may be performed using equipment and programs, as described in more detail below. The equipment and programs may be used by the researchers in assignment areas and/or the field offices, or alternatively, the equipment and programs may be used by technicians located elsewhere.

Figure 8:
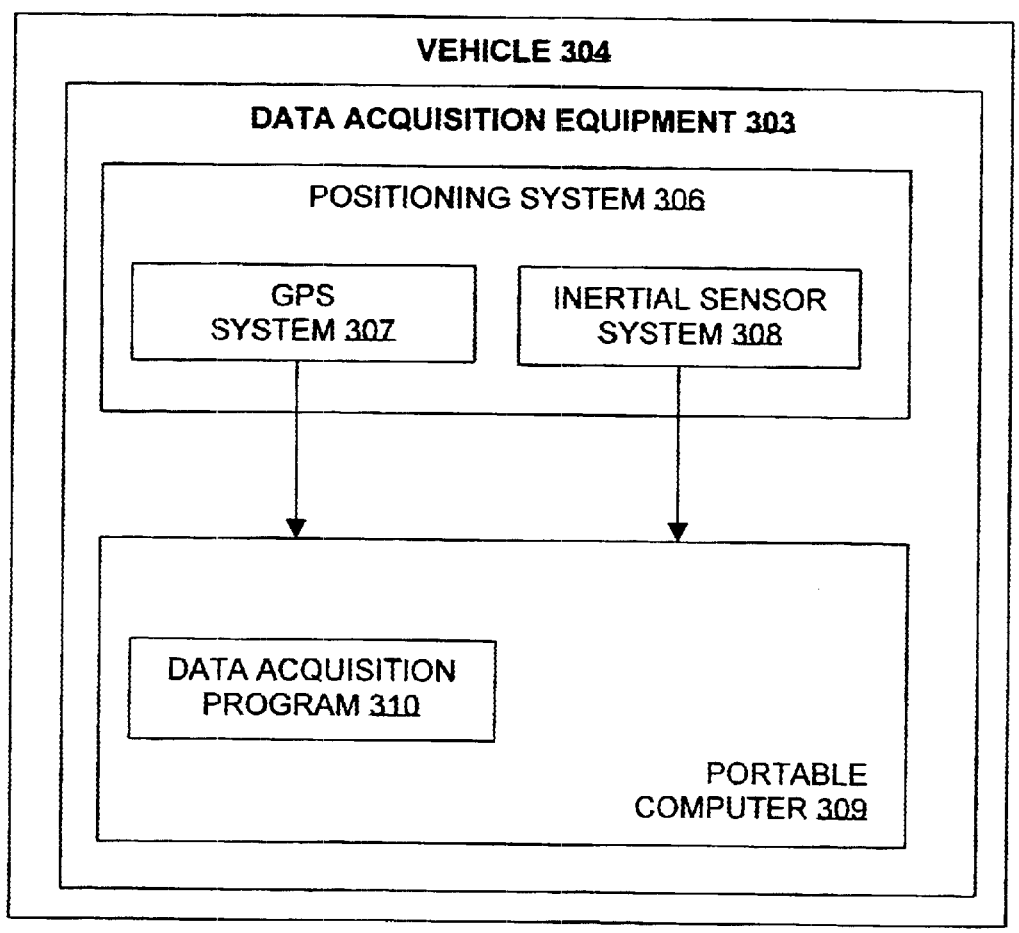
FIG. 8 is a block diagram of the components of the equipment installed in the vehicle used in the data collection step shown in FIG. 7.

A first step 302 in the data collection processes 300 includes driving a vehicle equipped with data acquisition equipment along the roads for which road position and geometry data are to be obtained. FIG. 8 shows the components of an embodiment the data acquisition equipment 303 installed in the vehicle 304. As shown in FIG. 8, the equipment 303 installed in the vehicle 304 includes a positioning system 306. The positioning system 306 is used to obtain the geographic coordinates of the vehicle 304 as the vehicle 304 is being driven along the roads. As shown in FIG. 8, the positioning system 306 includes both a GPS system component 307 and an inertial sensor component 308. The GPS system component 307 acquires geographic coordinates of the vehicle 304 using GPS satellite signals. The inertial sensor component 308 acquires data indicative of relative movement of the vehicle 304 in three dimensions, including data indicative of such vehicle acceleration, velocity, distance traveled. From these data the relative geographic coordinates can be obtained.

Also included in the vehicle 304 is a portable computer 309. Installed on the portable computer 309 is a data acquisition program 310. In one embodiment, the GPS system component 307, the inertial sensor component 308, and the portable computer 309 are connected together so that the data acquired by the GPS system component 307 and the inertial sensor component 308 can be stored on the portable computer hard drive. (In one alternative embodiment, a secondary GPS system may be used. The secondary GPS system acquires GPS satellite time stamp data so that a correlation can be made between the data collected by the primary GPS system component 307 and the data collected by the inertial sensor component 308.)

In one embodiment, the GPS system component 307 includes a DGPS unit manufactured by Ashtech. Other suitable systems are commercially available from Garmin, Trimble, and Satloc. The inertial sensor component includes a gyroscope unit manufactured by KVH Industries (of New Jersey). Alternatively, a unit that combines a gyroscope and an accelerometer may be used. The portable computer may be Pentium II-compatible notebook computer. Suitable units from other manufacturers may be used. One process for collecting DGPS data is described in the application Ser. No. 08/834,652, filed Apr. 11, 1997, the entire disclosure of which is incorporated by reference herein.

Figure 9:
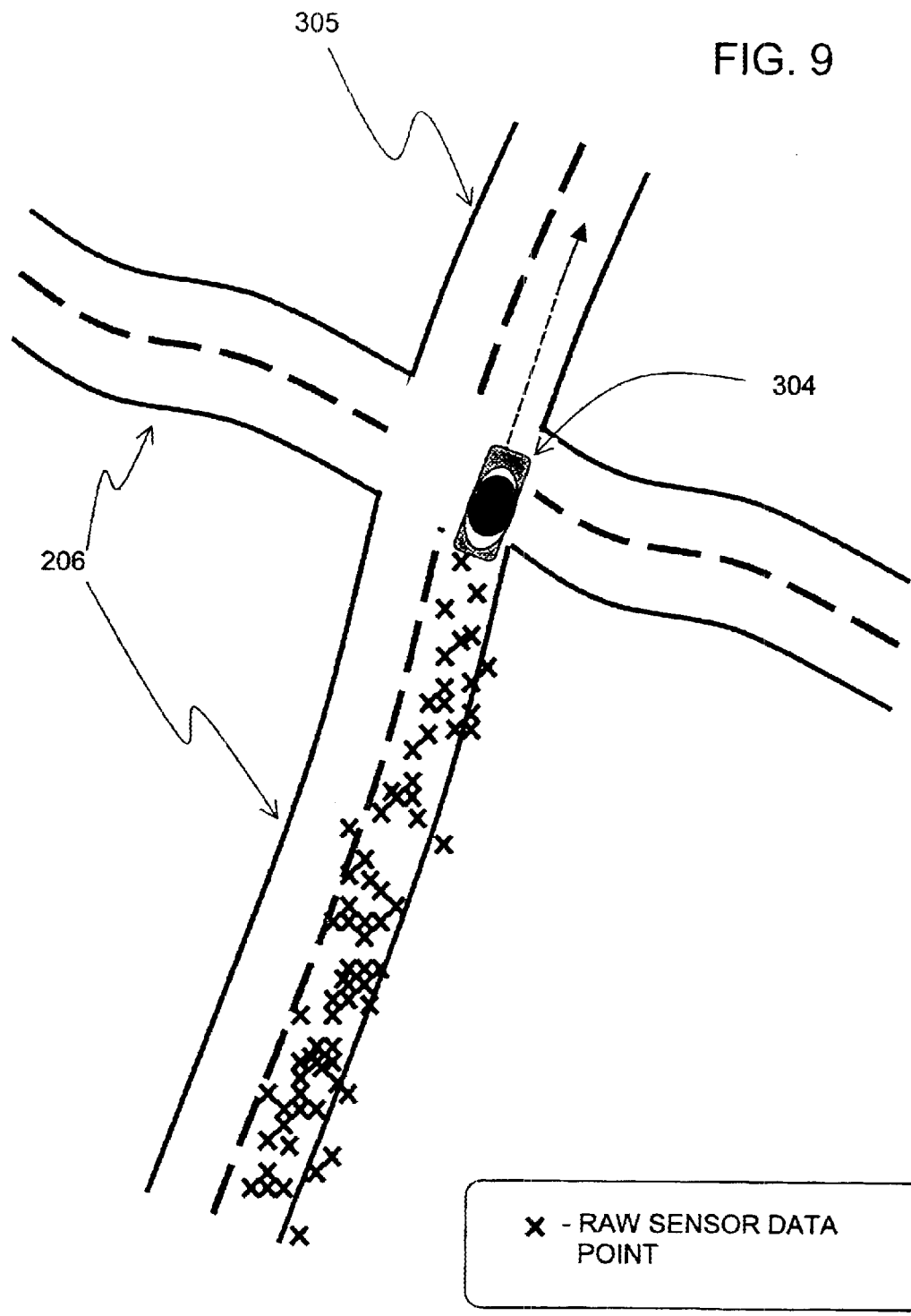
FIG. 9 is an illustration of a road upon which a vehicle is being driven for collecting road shape data according to an embodiment of the process shown in FIG. 7.

Referring to FIG. 9, the vehicle 304 is shown being driven along roads 305 for which road position data are to be acquired. In a preferred embodiment, the vehicle 304 is driven in a consistent, known position relative to the centerline of the road. For example, the vehicle 304 is driven in the center of the rightmost lane of the road whenever possible. (In countries in which vehicles are driven on the left hand side of the road, the vehicle would be driven in the center of the leftmost lane.)

Figure 7:
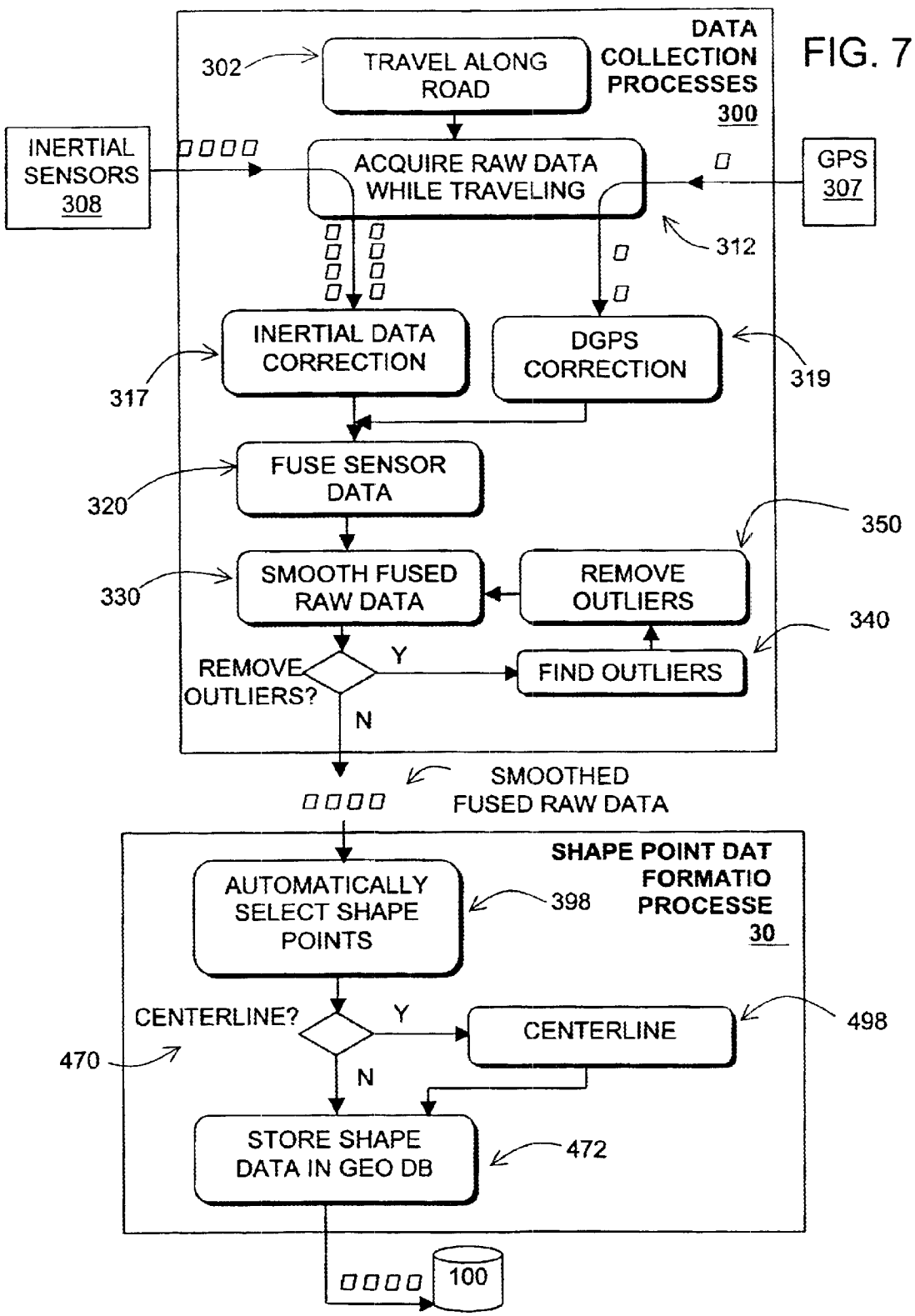
FIG. 7 is a flow diagram of a process according to a first embodiment for forming data that represents roads for the geographic database of FIG. 2.

As the vehicle 304 is being driven along the roads 305, the data acquisition program 310 (in FIG. 8) in the vehicle 304 acquires the data output by the sensors (Step 312 in FIG. 7). These data are referred to as "raw sensor data." The raw sensor data include different kinds of data depending on the kind of sensor from which the data is output. The GPS component 307 provides data indicating the geographic coordinates at a particular instant of time. The inertial sensory component 308 provides data indicating the acceleration of the vehicle at a particular instant of time.

The sensor components may output data at regular or irregular intervals. Also, the different sensor components may output data at different rates. For example, the inertial system component 308 may output data every 0.1 second from whereas the GPS system component 307 may output data every 1 second. The data acquisition program 310 acquires the raw sensor data from the different sensor components and stores the raw sensor data. Each item of data that is stored by the data acquisition program is associated with a time stamp, or other means of chronological identification, that indicates when the data had been acquired.

FIG. 9 shows a plurality of positions, labeled with X's, extending along the road 305 upon which the vehicle 304 is being driven. Each of the labeled positions corresponds to one acquisition of raw sensor data by the data acquisition program 310 from the positioning system 306 indicating the position of the vehicle 304 as the vehicle 304 is driven along the road 305. For various reasons, the data acquired by the positioning system 306 may not represent the true position of the vehicle at the instant when the data was acquired. Some of these reasons include GPS signal interference, sensor drift, calibration errors, etc.

In addition to acquiring data indicating the position of the vehicle, additional data are collected as the vehicle is being driven along the roads 305. For example, as the vehicle is being driven, the number of lanes of the road are recorded. Also, the lane widths are recorded. Road sign information may also be recorded along with the position along the road at which a road sign is located. The locations of points of interest along the road may be noted. Additional types of information that may be recorded include the speed limit, the address ranges, the street name, the type of road (e.g., expressway, alley, etc.), the road surface, and so on. Some of this information may be recorded automatically and some of this information may be recorded using input from the researcher. The data acquisition program 310 may include routines that allow some or all of these types of information to be saved using voice commands or using keyboard and/or pointing device input. If the data acquisition program 310 supports entry of data using voice commands, the data acquisition equipment 303 includes the appropriate hardware and software, such as a microphone, speaker, and voice recognition software. The voice command features of the data acquisition program 310 may be similar or identical to those described in the copending patent application entitled "Method and System Using Voice Commands for Collecting Data for a Geographic Database," Ser. No. 09/335,122, filed Jun. 17, 1999, the entire disclosure of which is incorporated by reference herein. Alternatively, some or all of these types of information may be recorded using maps or written ledgers.

In addition to acquiring data about the position of the vehicle as it is being driven, additional data may be acquired by other sensors in the vehicle. These other sensors may acquire data about the vehicle's heading and speed. These types of information may be associated with the vehicle position data and stored as data using the data acquisition program 310. In addition, the vehicle may be equipped with a camera. The camera may be mounted to take pictures in front of, to the sides of, and/or behind the vehicle as it is being driven. The camera may take pictures on a regular basis (such as every 50 meters, or more frequently). The pictures may be stored as data and the positions of the pictures associated with the vehicle position data using a routine in the data acquisition program.

Figure 10:
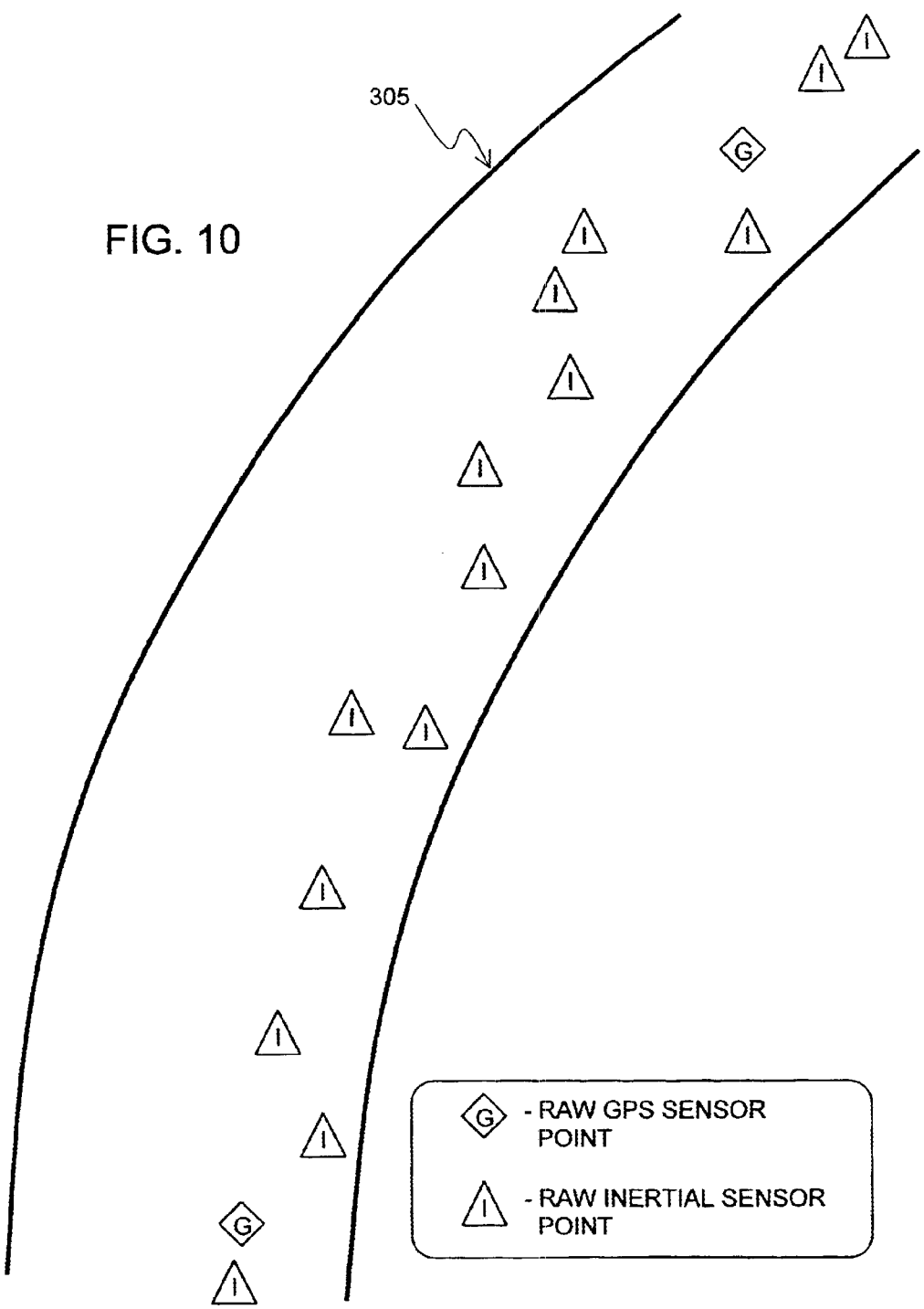
FIG. 10 is an enlargement of a portion of the illustration of FIG. 9 and shows raw data points.

FIG. 10 shows an enlargement of a portion of one of the roads 305 along which raw sensor data indicating the vehicle position have been acquired. As shown in FIG. 10, the raw sensor data include at least two types of data. One type of raw sensor data is GPS raw sensor data. The GPS raw sensor data have been acquired by the GPS system component 307 of the positioning system 306. A second type of raw sensor data is inertial system raw sensor data. The inertial system raw sensor data are acquired by the inertial system component 308 of the positioning system 306. Note that the GPS data and the inertial system data may be acquired at different rates. Accordingly, there may be a greater number of one of these types of data than the other. For example, the GPS data may be acquired once per second whereas the inertial system data may be acquired once every 0.1 second.

(Although FIG. 10 shows two different kinds of raw sensor data, there may be more than two different kinds. For example, there may be other kinds of sensor data acquired by other types of sensor components, such as compass readings, odometer readings, speed pulse readings, etc. Each of these various sensor components may acquire data at different rates.)

Referring again to FIG. 7, after raw sensor data has been acquired for a portion of the road network and saved on a data storage device, such as the hard drive of the portable computer 308 located in the vehicle, post-processing steps are performed on the raw sensor data. These post-processing steps may be performed at the field office using programs installed on a computer (such as the programs 122 installed on the computer 121 in FIG. 1). For example, one of these steps may include post-processing of the GPS data acquired while the vehicle was being driven using DGPS correction, if necessary (Step 319). With respect to the inertial system data, one of these post-processing steps may include deriving geographic coordinates from the acceleration data (Step 317).

The next step is to fuse the post-processed raw sensor data (Step 320). The post-processed raw sensor data are fused using a program installed on a computer (such as the computer 121 in FIG. 1) which may be located at the field office. The program that fuses the raw sensor data may be included among the programs 122 installed on one of the workstation computers 121 at the field office. Alternatively, the fusing step may be performed using a program installed on a computer located at another location.

Figure 11:
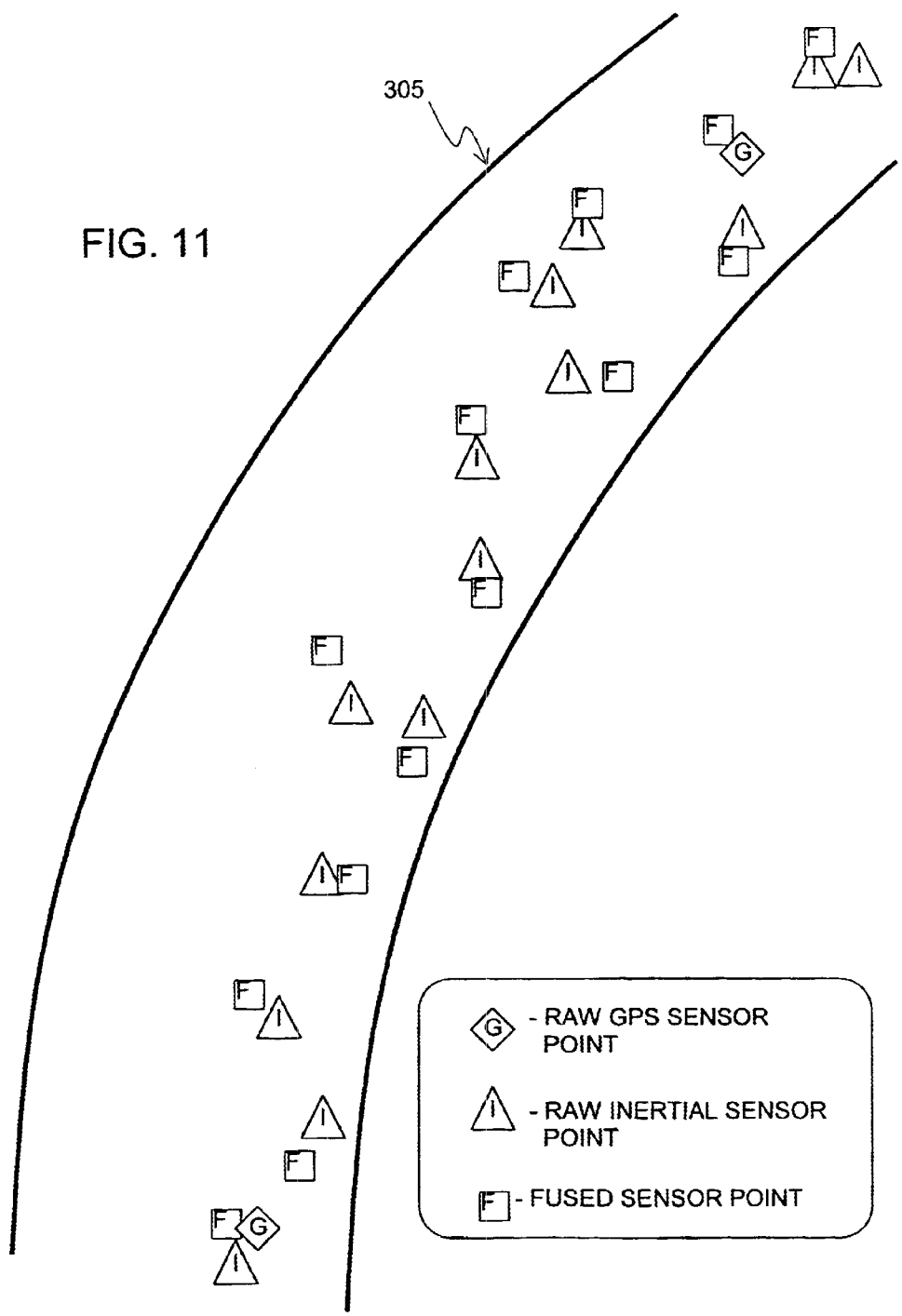
FIG. 11 shows the same portion of the road as shown in FIG. 10 and shows fused data points derived from the raw data points of FIG. 10.

The fusing step 320 is described in connection with FIG. 11. FIG. 11 shows the raw sensor data from FIG. 10, including the raw GPS data and the raw inertial sensor data. In the fusing process, each of these data entries may be modified by taking into account another type of data. For example, each raw inertial sensor reading acquired between two raw GPS sensor data readings may be adjusted (i.e., latitude, longitude, and optionally altitude modified) by the two raw GPS sensor data readings obtained before and after the raw inertial sensor reading. Further, the each raw inertial sensor reading may be adjusted by the curvature data obtained before, during, and after the raw inertial sensor reading. Likewise, each raw GPS sensor reading may be modified taking into account the raw inertial sensor data readings before and after the GPS data acquisition. Also, each raw GPS sensor reading may be adjusted by the curvature data obtained before, during, and after the raw GPS sensor reading. As a result of this fusing step, each raw inertial sensor data reading and each raw GPS sensor reading is fused forming a fused sensor reading. Each fused sensor reading includes the same components, e.g., geographic coordinates (including altitude), curvature, and grade.

Figure 12:
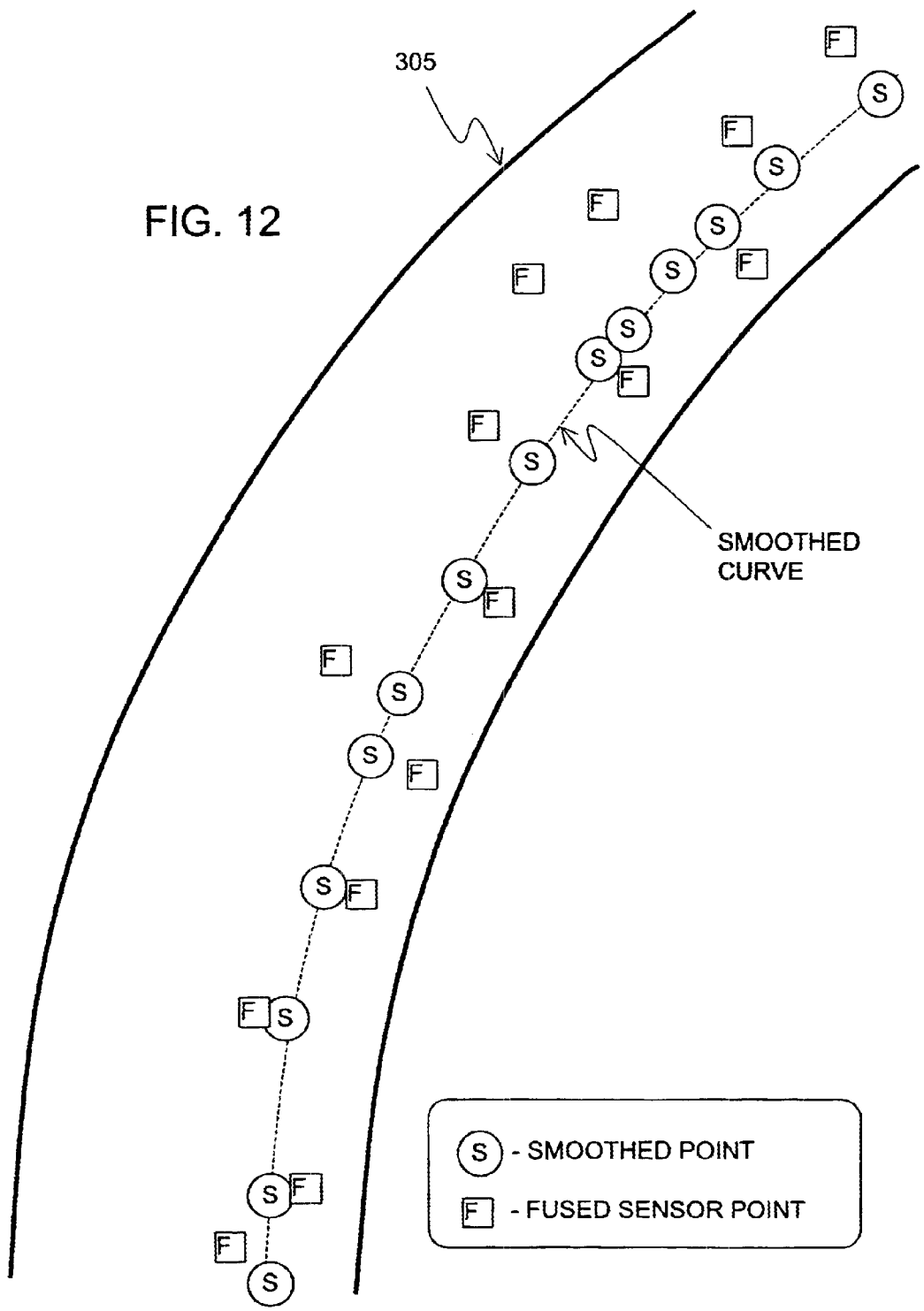
FIG. 12 shows the same portion of the road as shown in FIGS. 10 and 11 and shows smoothed data points derived from the fused data points in FIG. 11.

Referring to FIG. 7, according to one embodiment, after the fusing step, the fused data are smoothed (Step 330). The smoothing step 330 can be performed by a program on the same computer (i.e., computer 121 in FIG. 1) that performed the fusing step or alternatively, the smoothing step may be performed on a different computer. The program that performs the smoothing step may be included among the programs 122 installed on one of the workstation computers 121 at the field office. The smoothing step 330 is described in connection with FIG. 12. Programs, techniques, and algorithms for smoothing data points are known. One way to implement the smoothing is to use a least-squares fitted to a cubic equation. Another way to implement smoothing is to use a Kalman filter. The Kalman filter technique weighs each individual sensor error tolerance to determine how to smooth the points. FIG. 12 shows the locations represented by the fused data readings. Using the smoothing algorithm, the fused data points are smoothed. The smoothing process results in a plurality (i.e., more than one) of smoothed data points. In one embodiment, each of the fused data points results in one smoothed data point.

In an alternative embodiment, the fusing step 320 and the smoothing step 330 may be combined into a single fusing-smoothing step which is performed on the data at the same time.

After the fused data are smoothed, the next step is to remove outliers. Removal of outliers is an optional step that may be omitted in some alternative embodiments of the data collection processes (300 in FIG. 7). Referring to FIG. 7, removal of outliers includes the steps of identifying the outliers (Step 340) and removing the outliers (Step 350). The outlier identification and removal steps, 340 and 350, can be performed on the same computer that performed the fusing and smoothing steps 320 and 330, or alternatively, the outlier identification and removal steps may be performed on a different computer. The program that performs the steps of identifying outliers and then removing the outliers may be included among the programs 122 installed on one of the workstation computers 121 at the field office.

Figure 13:
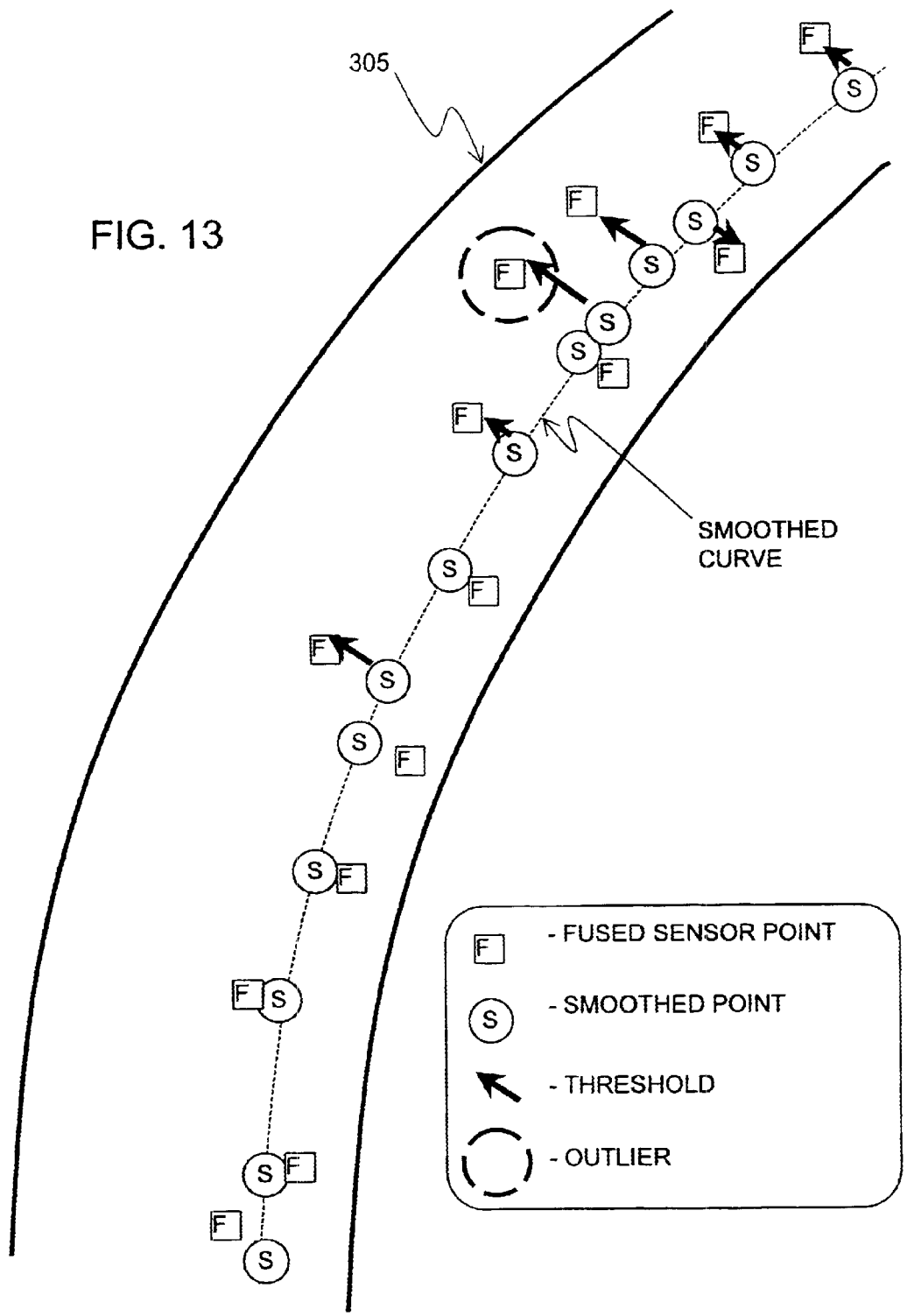
FIG. 13 shows the same portion of the road as shown in FIGS. 10–12 and shows an optional step of removing outliers.
Figure 14:
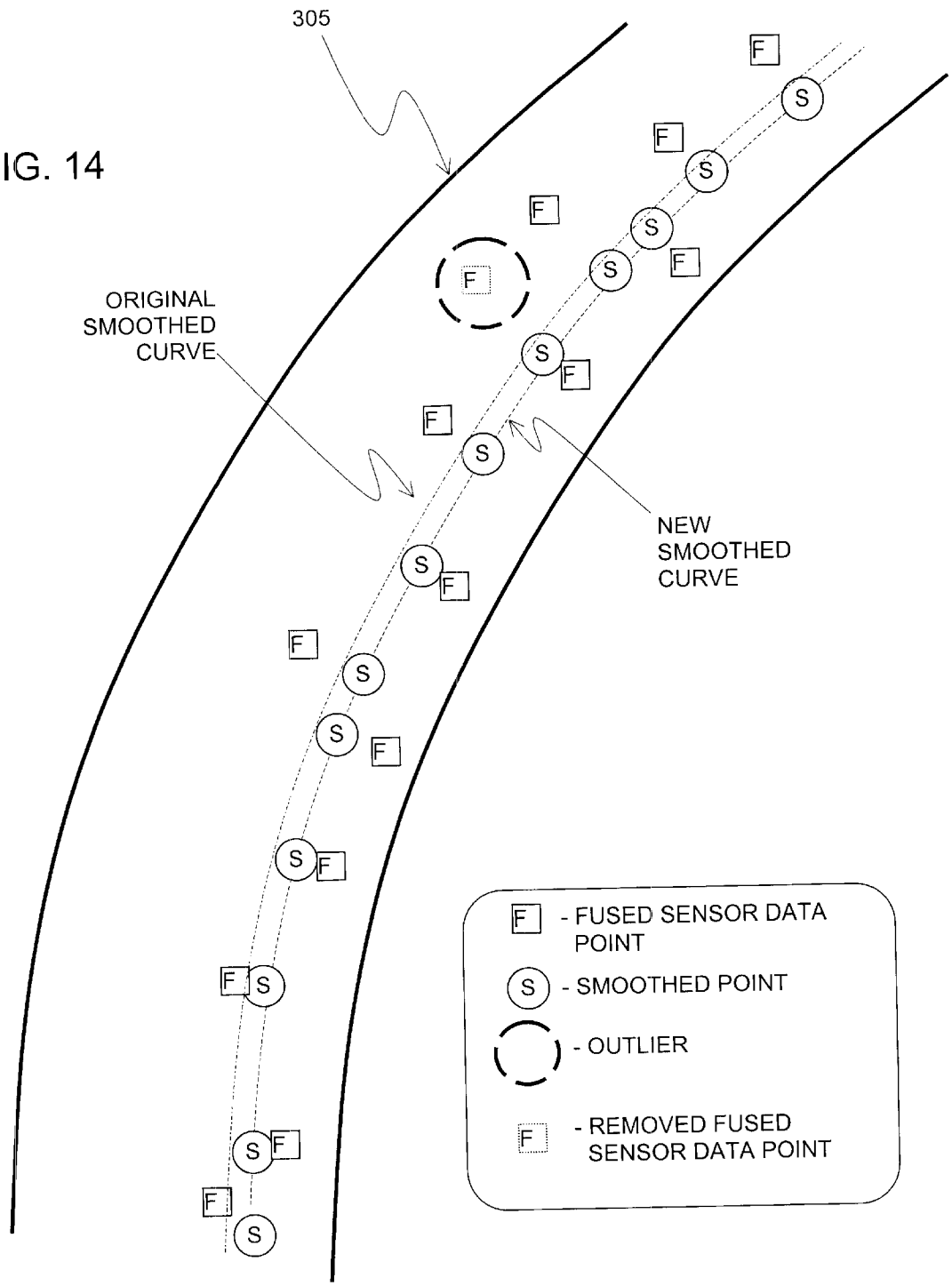
FIG. 14 shows the same portion of the road as shown in FIG. 13 and shows smoothed data points after removal of the outliers in FIG. 13.

The outlier identification and removal steps 340 and 350 are described in connection with FIGS. 13 and 14. FIG. 13 shows the smoothed data points from FIG. 12 as well as the fused sensor data points from which the smoothed data points were derived. In the outlier identification process 340, each fused data point is evaluated relative to the smoothed data point derived therefrom. Various kinds of evaluation may be used. One evaluation that may be used is to determine a distance between each fused data point and the smoothed data point derived therefrom. For each smoothed data point, this distance is compared to a configurable threshold distance. If the distance between the fused data point and the smoothed data point derived therefrom exceeds the threshold distance, the fused data point is identified as an outlier. FIG. 13 shows a fused data point that has been identified as an outlier because the distance between the fused data point to the smoothed data point derived therefrom exceeds a threshold distance. Using the outlier identification process 340, all the outliers included in the fused data points may be identified.

Referring again to FIG. 7, after the outliers in the original set of fused data have been identified, the outliers are removed, thereby forming a new set of fused data that excludes the outliers (Step 350). This new set of fused data is smoothed again. In one embodiment, the same smoothing algorithm used to smooth the fused data the first time may be used again (Step 330). Alternatively, the new set of fused data with the outliers removed may be smoothed using a different smoothing algorithm. FIG. 14 illustrates application of the smoothing algorithm to the new set of fused data. As shown in FIG. 14, the outlier identified in FIG. 13 has been removed. The smoothing algorithm is applied to the remaining fused data points. Because the outliers have been removed, the new smoothed curve resulting from the application of the smoothing algorithm to the new set of fused data points may be displaced from the previous smoothed curve. Likewise, a new set of smoothed data points, which lie along the new smoothed curve, may be displaced from the corresponding original smoothed data points. (Note that the new smoothed curve does not include a smoothed data point corresponding to the identified outlier.)

The steps of identifying and removing outliers (Steps 340 and 350) may be performed more than once. For example, after a new set of smoothed data has been prepared, outliers may be identified again using an evaluation of the displacement of each of the remaining fused data points from its corresponding new smoothed data point. When performing this evaluation, a threshold distance may be used that is the same as the threshold distance that was used the previous time, or alternatively, a different threshold distance may be used.

The number of times that the outlier removal steps (Steps 340 and 350) are performed may be configurable. Alternatively, the outlier steps may be performed until no outliers are identified with a given distance threshold.

IV. AUTOMATIC GENERATION OF SHAPE POINT DATA FOR A GEOGRAPHIC DATABASE

A. Automatic Shape Point Selection

Figure 15:
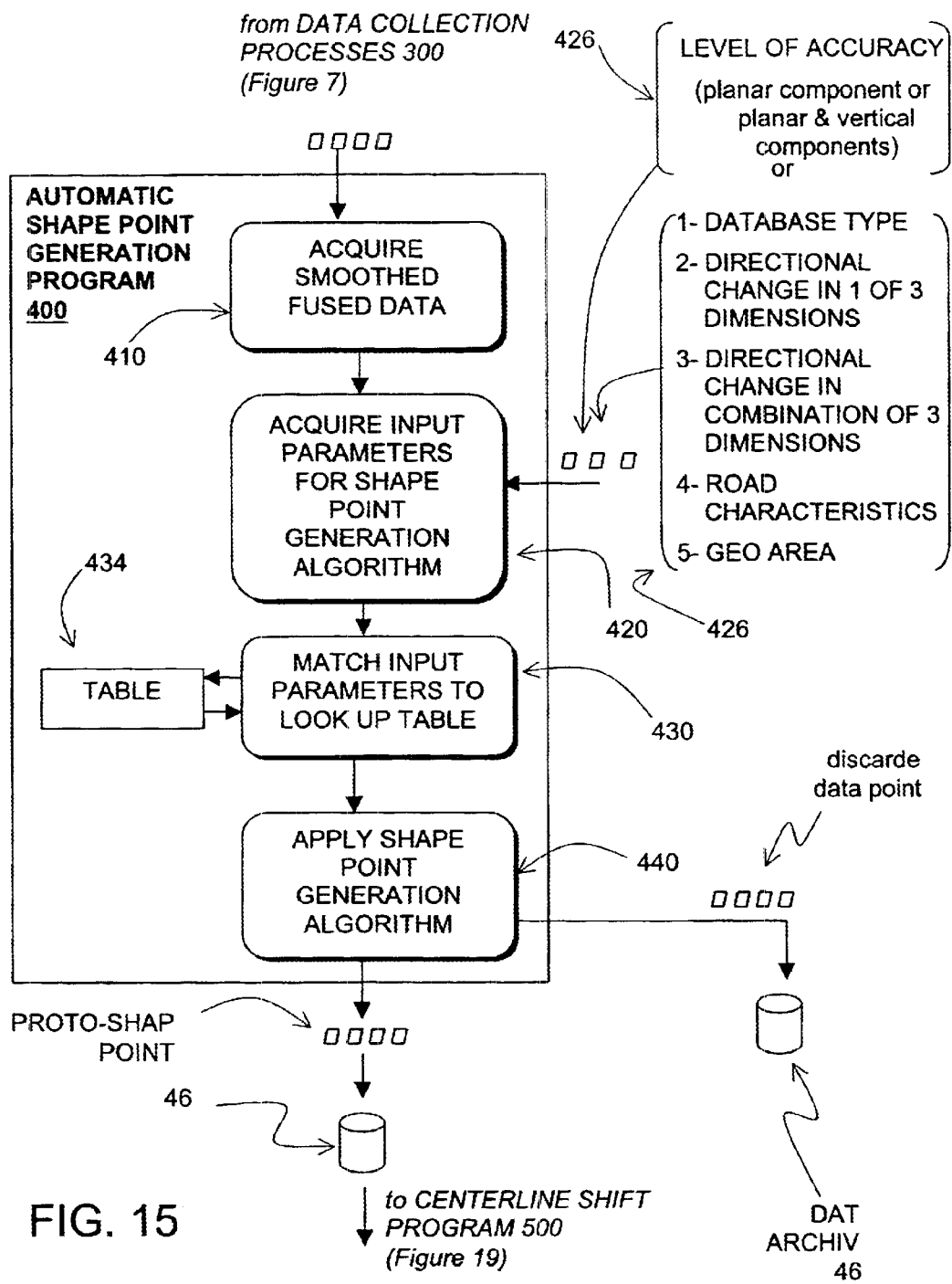
FIG. 15 is a flow diagram of the steps in a portion of the process shown in FIG. 7 for automatically selecting which of the collected data point to be used to form shape points for the geographic database.

Referring to FIG. 7, after the fused data are smoothed one or more times, the resulting set of smoothed fused data is used by the shape point formation processes 301 to form shape point data for the primary copy 100 of the geographic database (in FIG. 1). One of these processes 301 is to automatically select which of the fused smoothed data to use to form shape points (Step 398). The step 398 of automatically selecting shape points is performed by an automatic shape point generation program 400, some of the components of which are shown in FIG. 15. The shape point generation program 400 may be included among the programs 122 installed on the one or more workstation computers 121 located at the field office. Alternatively, the shape point generation program 400 may be installed on another computer, such as the computer 308 (in FIG. 8) used to collect the road position data.

FIG. 15 shows the component steps performed by an embodiment of an automatic shape point generation program 400. The steps performed by the automatic shape point generation program 400 are part of the processes (301 in FIG. 7) used to form shape point data from the smoothed fused data for the master copy 100 of the geographic database (in FIG. 1).

A first step (Step 410) performed by the shape point generation program 400 is to receive the smoothed fused data from the data collection processes 300. If the shape point generation program 400 is installed on the same computer used to perform the steps of fusing and smoothing the raw data, this step may involve reading a file which is already stored on the computer.

Another step (Step 420) performed by the shape point generation program 400 is to accept input parameters 426. These input parameters 426 may be provided to the shape point generation program 400 in two ways. One way is to specify an accuracy level. The accuracy level may be specified as a distance. For example, the accuracy level may be specified as 1 meter, 5 meters, 0.5 meters, etc.

There are various ways to determine the accuracy level to specify. According to one embodiment, the accuracy level is determined based upon the applications that are expected to use the database products derived from the primary copy of the geographic database. The application that requires the greatest accuracy is identified. Then, an accuracy level is specified which is consistent with the accuracy needed for this application. For example, if automatic vehicle control applications (such as obstacle warning and avoidance, curve warning, advanced cruise control, headlight aiming, and so on) require the greatest accuracy, then the level of accuracy for the master copy is specified to be at least as accurate as the accuracy level needed for these automatic vehicle control applications.

In one embodiment, for applications that require a high level of accuracy, a value between approximately 3 and 5 meters may be specified. For applications that require a higher level of accuracy, a value between approximately 1 and 3 meters may be specified. For applications that require the highest level of accuracy, a sub-meter accuracy level (e.g., 0.5) is specified. For applications that require lower accuracy, an accuracy level above 5 meters may be specified.

According to a present embodiment, the accuracy level specified to the automatic shape point generation program may include two components: a planar tolerance component and a vertical tolerance component. The planar tolerance component is used to define an accuracy level for the geographic database horizontally (i.e., in a plane with respect to the surface of the earth, such as latitude and longitude). The vertical tolerance component is used to define a level of accuracy for the geographic database vertically (i.e., altitude). The planar tolerance component and the vertical tolerance component may be set to the same value (e.g., "1 meter") or may be set to different values (e.g., "1 meter" for the planar component and "5 meters" for the vertical component.) (Alternatively, the planar and/or vertical tolerances may be specified as a relative values instead of absolute values. For example, the planar and/or vertical tolerances may be specified as 10% and 15% respectively.)

An alternative way to provide input parameters is to specify types of predetermined inputs. Some of these types of predetermined inputs are designed to facilitate the consistent selection of appropriate parameters. Examples of these types of predetermined inputs may include the following:

(1). A database type. This type of input relates an accuracy level for the shape point data to the type of application that is expected to use the geographic database for which the shape data are being provided. To use this type of input parameter, a researcher specifies a type of database application, such as "drivers' assistance" or "navigation-related." As described further below, when a type of database application is specified, a look up table (e.g., 434, described below) is used that relates the type of database application to an accuracy level. Thus, if the researcher inputs "navigation", an accuracy level of "5 meters" is specified. If the researcher inputs "drivers' assistance", an accuracy level of "1 meter" is specified.

(2). Directional changes in any one of three dimensions. This input parameter provides that a shape point be generated any time there is a change of a specified distance in any one of three dimensions. (Alternatively, this input parameter may specify that a shape point be generated any time there is a relative change in any one of three dimensions, such as a change of a specified percent.)

(3). Directional changes in any combination of three dimensions. This input parameter provides that a shape point be generated any time there is a change of a specified distance in any combination of three dimensions. (Alternatively, this input parameter may specify that a shape point be generated any time there is a relative change in any combination of three dimensions, such as a change of a specified percent.)

(4). Road characteristics. This type of input relates an accuracy level for the shape point data to a characteristic of the road. To use this type of input parameter, a look up table (e.g., 434) is used that relates road characteristics to accuracy levels. Thus, if the road is characterized as an "expressway" a certain level of accuracy is used (e.g., 1 meter). If the road is characterized as an "alley", a different accuracy level (e.g., 5 meter) may be used. Other road characteristics that may be used include number of lanes, speed limit, surface (e.g., paved, gravel), and so on.

(5). Geographic area. This type of input relates an accuracy level for the shape point data to the city, state, country, etc., the road is located in. To use this type of input parameter, a look up table (e.g., 434) is used that relates locations to accuracy levels. Thus, if the road is located in an unincorporated area, a different accuracy level may be used than if the road is located in a municipality.

One or more of these parameters 426 may be specified into the shape point generation program 400. If one of these parameters is not specified, the shape point generation program 400 may use a default value. After the input parameters 426 are received, some of these parameters may be matched to numeric values (Step 430). A look up table 434 may be used for this purpose. The look up table 434 includes accuracy values related to specified parameter entries. For example, a speed limit entry value of "55 mph" may correspond to a directional change value of "1 meter."

After the desired level of accuracy is specified for the resultant geographic database, the shape point generation program 400 runs a shape point generation algorithm on the smoothed fused data (Step 440). The shape point generation algorithm determines which of the smoothed fused road position data to discard. The smoothed fused road position data that are discarded are unnecessary to provide the desired level of accuracy for the geographic database. The smoothed fused road position data that are not discarded are used to form shape point data for the geographic database. The smoothed fused road position data that are not discarded are necessary to provide the desired level of accuracy for the geographic database.

The shape point generation algorithm operates on a road segment by road segment basis. Thus, the shape point generation algorithm determines which fused data points to discard with respect to one road segment before proceeding to determine which fused data points to discard with respect to the next road segment. Accordingly, as an initial step, the fused data points corresponding to the nodes at the end points of a road segment are determined. As mentioned above in connection with FIG. 5, in a database representation of a road segment, data attributes are stored to indicate the locations of the end points (i.e., nodes) at each end of a road segment. Therefore, as part of the process of the shape point generation algorithm, the two fused data points located closest to the end points of the road segment being represented are identified and these two fused data points are indicated as being used to represent the nodes at the end points of road segment. (These two fused data points are not marked for discarding.)

After the fused data points corresponding to the end points of the road segment are identified, the shape point generation algorithm determines which fused data points located between these end points can be discarded. The shape point generation algorithm provides for a series of evaluations. In general, the shape point generation algorithm evaluates whether each smoothed fused data point deviates enough from a straight line generated from a previous data point so that a shape point corresponding to the data point being evaluated should be included in the database. The evaluation process continues until all the fused data points that are located along the road segment being represented are evaluated.

Figure 16A:
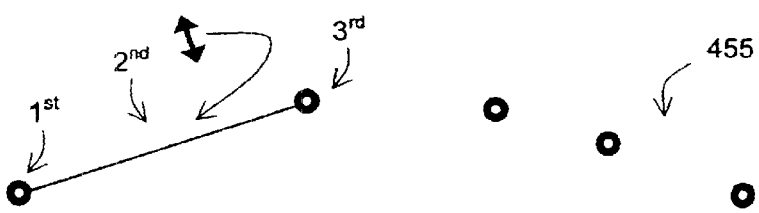
FIGS. 16A–16E show application of the process of FIG. 15 to automatically generate shape points for a geographic database.

The process used by the shape point generation algorithm in order to determine which smoothed fused data to discard is described in connection with FIGS. 16A–16E. FIGS. 16A–16E illustrate application of the shape point generation algorithm to a series of smoothed fused data points 455. The data points 455 in FIG. 16A are the data points provided by the output of the data collection processes 300 (in FIG. 7). These data points 455 represent the vehicle path (after smoothing, if performed) as the vehicle was being driven along the road, and hence the data points in FIG. 16A outline the geometry of the road upon which the vehicle was being driven.

One of the points in FIG. 16A is selected as a starting point of a straight line approximation of the represented road. In one embodiment, the point selected as the starting point is the point that coincides with the node at an endpoint of the road segment. In FIG. 16A, the first point is selected as the starting point. From the starting point (i.e., the first point), a straight line is determined between the first point and the third point, skipping the intermediate (i.e., the second) point. The straight line connecting the first and third data points represents a proposed approximation of the road shape. This proposed approximation of the road shape is evaluated by the shape point generation algorithm to determine whether it satisfies the specified criterion (from Step 420) for the accuracy of the road. This evaluation includes determining the distance between the intermediate point and the straight line connecting the first and third points and then comparing this distance to a threshold distance. (This distance is calculated as the shortest distance and therefore is the distance along a line normal to the straight line connecting the first and third points.) The threshold distance is configurable (as described above) and specified by or derived from the input parameters 426 used to specify the level of accuracy of the geographic database.

In FIG. 16A, the distance between the intermediate point and the line connecting the first and third points is less than the threshold distance. If the distance between the intermediate point and the line connecting the first and third points is less than the threshold distance, the intermediate point can be marked for discarding. Then, the shape point generation algorithm proceeds to examine the next data point in the series 455.

Figure 16B:
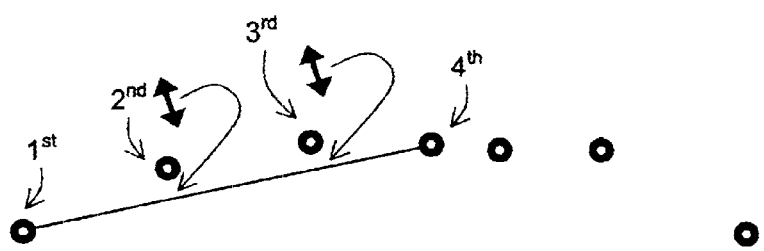

Referring to FIG. 16B, the shape point generation algorithm calculates a straight line between the first data point and the fourth data point, skipping the intermediate data points (i.e., the second and third data points). The distance between the second data point and the straight line connecting the first and fourth data points is determined and compared to the threshold distance. Also, the distance between the third data point and the straight line connecting the first and fourth data points is determined and compared to the threshold distance. In FIG. 16B, neither of these distances is greater than the threshold distance. Therefore, the third data point can be marked for discarding. Then, the shape point generation algorithm proceeds to examine the next data point in the series.

Figure 16C:
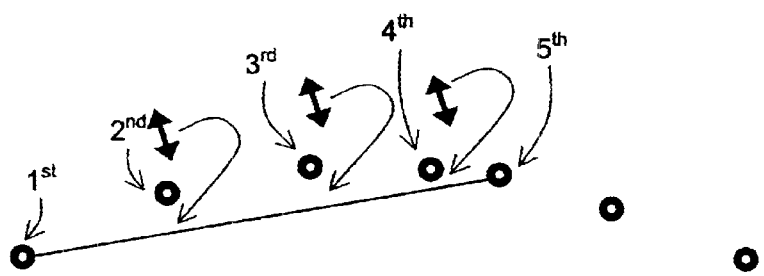
Figure 16D:
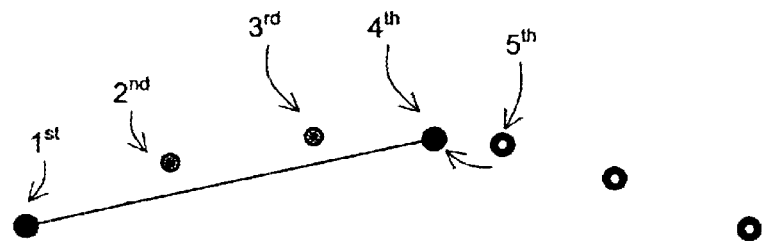

Referring to FIG. 16C, the shape point generation algorithm calculates a straight line between the first data point and the fifth data point. As before, the distances between each of the intermediate data points and the straight line are determined. In this case, the distances of the second, third, and fourth data points to the straight line are determined. Each of these distances is compared to the threshold distance. As before, if none of these distances exceeds the threshold distance, the fourth data point can be marked for discarding and the next data point would be evaluated, and so on. However, in FIG. 16C, the straight line distance between the third data point and the straight line connecting the first and fifth data points exceeds the distance threshold. When any one of the intermediate data points (i.e., the second, third, or fourth) is more distant from a straight line connecting the first and fifth points than the threshold distance, a determination is made that the path of the road is curved enough that the straight line representing the approximation of the road does not sufficiently describe the actual road shape. Therefore, the immediately previous data point in the series (i.e., in this case, the fourth data point) is determined as being necessary so that a straight line connecting the first and fourth data points sufficiently approximates the road shape, as shown in FIG. 16D. (The fourth data point is necessary so that none of the intermediate data points, i.e., the second and third, is more distant from the straight line approximation than the distance threshold.) Thus, since the fourth data point is determined as necessary, the fourth data point is selected as a proto-shape point. (The selected data point is referred to as a "proto-shape point" because the data point may be modified by the automatic centerlining program 500, described below.) The fourth data point and the first data point are marked as proto-shape points and data indicating their selection as proto-shape points are stored. If the automatic shape point generation program 400 is being run on the computer workstation 121 at the field office, the data indicating the status of these points as proto-shape points may be stored on the hard drive of the computer. In an alternative embodiment, the proto-shape points may be stored separately, in a separate file and/or on a separate data storage device 460.

The second and third data points in FIG. 16D are marked as discarded. This means that the data representing the second and third data points are not used in the formation of shape point data for the geographic database 100. Data indicating the discarded status of these data points are stored.

Figure 16E:
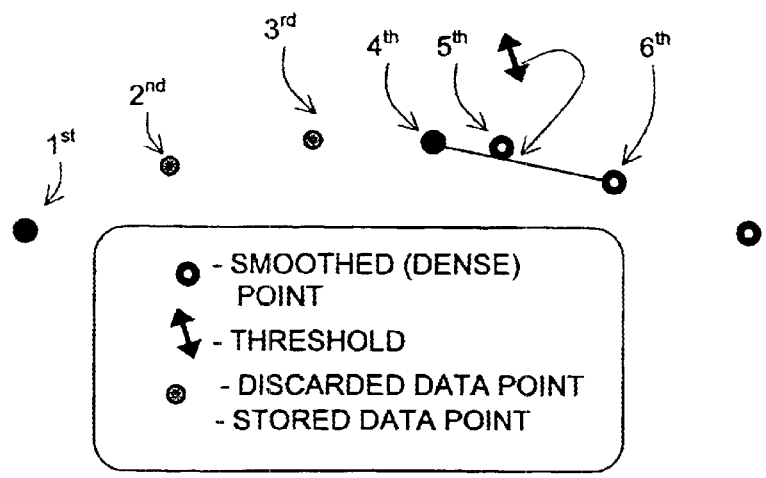

After the fourth data point has been selected as a proto-shape point, the fourth data point is used as the starting end of a new straight line approximation of the road shape. This is illustrated in FIG. 16E. A straight line is formed connecting the fourth data point and the sixth data point, skipping the intermediate data point, i.e., the fifth data point. As before, the distance between the intermediate data point (i.e., the fifth data point) and the straight line approximation between the fourth data point and the sixth data point is compared to the threshold distance. If the distance exceeds the threshold distance, the fifth data point is selected as a proto-shape point. On the other hand, if the distance between the fifth data point and the straight line connecting the fourth data point and the sixth data point does not exceed the threshold, a straight line approximation is calculated between the fourth data point and the seventh data point, and so on.

Using the above described process, all the fused data points along the road segment are evaluated. All the fused data points along a segment are evaluated when the fused data point that coincides with the node at the far end of the road segment is encountered. As mentioned above, the data associated with the fused data point located at the far end of the road segment will be used to represent a node of the road segment in the resultant database. This fused data point will also be used to form the node at the starting end of the next segment. Therefore, the shape point generation algorithm uses this fused data point as the starting point for evaluation of the fused data points along the next road segment. The fused data points along the next segment are evaluated in the same manner as the fused data points were evaluated in the prior segment. In this manner, all the fused data points along all the road segments are evaluated As the fused data points for all the road segments are evaluated, those data points that are selected as "proto-shape points" and data indicating the status of these points as proto-shape points is stored in the data storage 460.

Referring again to FIG. 16D, it was stated above that the second and third data points in FIG. 16D are marked for discarding. Although the data representing the second and third data points are not used in the formation of shape point data for the geographic database 100, they may not be actually thrown away. Instead, the second and third data points (along with the rest of the smoothed fused data, including the discarded data points) may be stored in a data archive 466. The data in the data archive 466 may be used at a later time to form different databases having different levels of accuracy. For example, if a database with a greater accuracy is desired at some later time, a different, lower threshold distance would be specified in the shape point generation program 400. Then, the shape point generation program 400 would be run again using the smoothed fused data that had been stored in the data archive 466. When run with the lower distance threshold, some of the smoothed fused data points that had been marked as discarded the first time would be selected as proto-shape points when the shape point generation program is run again. (Similarly, some of the fused data points that had been selected the first time may not be selected the second time.)

According to one embodiment of the shape point generation algorithm, an exception to the process described in FIGS. 16A–16E is made when the last fused data point located at the far end of a road segment is encountered. As stated above, the last fused data point located at the far end of the road segment is used to form a node of the segment. Therefore, the data associated with this fused data point (corresponding to the far node of the segment) will be included in the geographic database regardless of how close it is located to the immediately prior fused data point which had been determined as a proto-shape point. It may occur that the fused data point corresponding to the node at the far end of the road segment will be relatively close to that fused data point determined as a proto-shape point immediately prior to it. If this occurs, a balancing process is performed by the shape point generation algorithm. According to this balancing process, a new fused shape point is selected as the proto-shape point immediately prior to the end point. The new fused data point is selected to balance the distances between the two proto-shape points immediately prior to the end point. To implement this balancing step, the second closest proto-shape point (determined by the evaluations performed by the shape point generation algorithm) prior to the far node is identified. Then, all the fused data points (including any fused data points that had already been marked for discarding) located between this point and the end point are evaluated. The data point located approximately half way between the second closest proto-shape point and the end point is identified.

The process described in connection with FIGS. 16A–16E relates to the planar component of the level of accuracy. With respect to the vertical component, a separate test is performed as each fused data point is evaluated. As each fused data point is evaluated, a change of altitude is calculated relative to the altitude of the previous fused data point that had been selected as a proto-shape point. If the change of altitude is greater than the specified vertical component of the level of accuracy, the immediately previous fused data point is selected as a proto-shape point so that the change in altitude between two proto-shape points does not exceed the vertical component of the specified level of accuracy.

Alternative Process for Selection of Shape Data to Discard

An alternative process can be used when the fused data points represent a road along which the curvature direction reverses. (An S-shaped road is an example of a road along which the curvature direction reverses.) The process as described in connection with FIGS. 16A–16E can be used to select which fused data points to discard when the curvature of the road reverses. However, it may be preferable under some circumstances to modify the process described in FIGS. 16A–16E when the fused data points represent a road along which the curvature reverses direction. In a data representation of a road along which a reversal of curvature direction occurs, it would be preferable to identify, as closely as possible, that point at which the curvature reverses direction. Accordingly, it may be preferable to select as a proto-shape point that fused data point that is closest to the location at which the direction of curvature reverses even if the fused data point would not otherwise be selected as a proto-shape point.

An example of how this alternative process is applied is shown in FIGS. 17A–17E. FIG. 17A shows a series of fused data points 456. These fused data points follow an S-shaped path. As in the embodiment described in connection with FIGS. 16A–16E, one of the points in FIG. 17A is selected as a starting point of a straight line approximation of the represented road. From the starting point (i.e., the first point), a straight line is determined between the first point and the third point, skipping the intermediate (i.e., the second) point. The straight line connecting the first and third data points represents an approximation of the road shape which is evaluated to determine whether it satisfies the specified criterion for the accuracy of the road. As in the previously described process, this evaluation includes determining the distance between the intermediate point and the straight line connecting the first and third points and then comparing this distance to a threshold distance. If the distance between the intermediate point and the line connecting the first and third points is less than the threshold distance the next point in the series is evaluated.

FIG. 17B shows a straight line connecting the first and fourth points. This embodiment of the shape point generation algorithm performs an evaluation of the distances between both the intermediate points (i.e., the second and third points) and the straight line connecting the first and fourth points. In FIG. 17B, neither of these distances is greater than the threshold distance. The shape point generation algorithm proceeds to examine the next data point in the series.

In FIG. 17C, the shape point generation algorithm calculates a straight line between the first data point and the fifth data point. Note that in FIG. 17C, the third and fourth data points are on the opposite side of the straight line connecting the first and fifth data points. As before, the distances between each of the intermediate data points (i.e., the second, third, and fourth points) and the straight line are determined. Each of these distances is compared to the threshold distance. As before, if none of these distances exceeds the threshold distance, the next data point would be evaluated, and so on. However, in FIG. 17C, the straight line distance between the fourth data point and the straight line connecting the first and fifth data points exceeds the distance threshold. When any one of the intermediate data points is more distant from a straight line connecting the first and fifth points than the threshold distance, a determination is made that the path of the road is curved enough that the straight line representing the approximation of the road does not sufficiently describe the actual road shape. Therefore, the point at which the curvature changed (i.e., in this case, the third data point) is selected as a "proto"-shape point, as shown in FIG. 17D. The third data point and the first data point are marked as proto-shape points and data indicating their selection as proto-shape points are stored. The second data point in FIG. 17D is marked as discarded, as described in connection with the previous embodiment.

After the third data point has been selected as a proto-shape point, the third data point is used as the starting end of a new straight line approximation of the road shape. This is illustrated in FIG. 17E. A straight line is formed connecting the third data point and the fifth data point, skipping the intermediate data point, i.e., the fourth data point. As before, the distance between the intermediate data point (i.e., the fourth data point) and the straight line approximation between the third data point and the fifth data point is compared to the threshold distance. If the distance exceeds the threshold distance, the fourth data point is selected as a proto-shape point. On the other hand, if the distance between the fourth data point and the straight line connecting the third data point and the fifth data point does not exceed the threshold, a straight line approximation is calculated between the third data point and the sixth data point, and so on. The process continues until all the smoothed fused data points are evaluated.

As before, the data not used in the formation of the geographic database may be stored in a data archive and used at a later time to form different databases having different levels of accuracy.

The process described in connection with FIGS. 17A–17E may be used as a substitute for, in addition to, or as a supplement to the process described in FIGS. 16A–16E.

Another Alternative Process for Selection of Shape Data to Discard

The process described in connection with FIGS. 16A–16E is one way that the shape point generation algorithm can use to determine which smoothed fused data to discard. An alternative process is described in connection with FIGS. 18A–18E. Like the process described in connection with FIGS. 16A–16E, the process described in FIGS. 18A–18E includes a series of evaluations by the shape point generation algorithm to determine which smoothed fused data points deviate enough from a straight line generated from a previous data point so that a shape point should be included in the database.

FIG. 18A shows the same series of fused data points 455 that are shown in FIGS. 16A–16E. One of the points in FIG. 18A is selected as a starting point of a straight line approximation of the represented road. From the starting point (i.e., the first point), a straight line is determined between the first point and the third point, skipping the intermediate (i.e., the second) point. The straight line connecting the first and third data points represents an approximation of the road shape which is evaluated to determine whether it satisfies the specified criterion for the accuracy of the road. As in the process described in connection with FIGS. 16A–16E, this evaluation includes determining the distance between the intermediate point and the straight line connecting the first and third points and then comparing this distance to a threshold distance. If the distance between the intermediate point and the line connecting the first and third points is less than the threshold distance the next point in the series is evaluated.

FIG. 18B shows a straight line connecting the first and fourth points. This embodiment of the shape point generation algorithm performs an evaluation of the distances between both the intermediate points (i.e., the second and third points) and the straight line connecting the first and fourth points. In FIG. 18B, neither of these distances is greater than the threshold distance. The shape point generation algorithm proceeds to examine the next data point in the series.

In FIG. 18C, the shape point generation algorithm calculates a straight line between the first data point and the fifth data point. As before, the distances between each of the intermediate data points (i.e., the second, third, and fourth points) and the straight line are determined. Each of these distances is compared to the threshold distance. As before, if none of these distances exceeds the threshold distance, the next data point would be evaluated, and so on. However, in FIG. 18C, the straight line distance between the third data point and the straight line connecting the first and fifth data points exceeds the distance threshold. When any one of the intermediate data points is more distant from a straight line connecting the first and fifth points than the threshold distance, a determination is made that the path of the road is curved enough that the straight line representing the approximation of the road does not sufficiently describe the actual road shape. Therefore, the point that exceeded the threshold distance (i.e., in this case, the third data point) is selected as a "proto"-shape point, as shown in FIG. 18D. The third data point and the first data point are marked as proto-shape points and data indicating their selection as proto-shape points are stored. The second data point in FIG. 18D is marked as discarded, as described in connection with the previous embodiment. (If more than one intermediate point exceeded the threshold distance, the first of these points would be chosen as the proto-shape point.)

After the third data point has been selected as a proto-shape point, the third data point is used as the starting end of a new straight line approximation of the road shape. This is illustrated in FIG. 18E. A straight line is formed connecting the third data point and the fifth data point, skipping the intermediate data point, i.e., the fourth data point. As before, the distance between the intermediate data point (i.e., the fourth data point) and the straight line approximation between the third data point and the fifth data point is compared to the threshold distance. If the distance exceeds the threshold distance, the fourth data point is selected as a proto-shape point. On the other hand, if the distance between the fourth data point and the straight line connecting the third data point and the fifth data point does not exceed the threshold, a straight line approximation is calculated between the third data point and the sixth data point, and so on. The process continues until all the smoothed fused data points are evaluated.

As stated in connection with FIGS. 16A–16E, the data not used in the formation of the geographic database may be stored in a data archive and used at a later time to form different databases having different levels of accuracy.

The processes described in connection with FIGS. 16A–16E and FIGS. 18A–18E may be used in combination. Both these processes may be run on a collection of smoothed raw data and the results compared for size, accuracy, smoothness, etc. The process that provides the best results, based upon specifiable criteria, may be used.

The process described in connection with FIGS. 18A–18E may also be used with the process described in FIGS. 17A–17E.

In alternative embodiments, one of these processes may be used for some kinds of databases and the other of these processes may be used for other kinds of databases. In another alternative, both these processes may be used in the same database. For example, one process may be used for some areas or types of roads and the other process may be used for other areas or types of roads.

B. Forming Shape Point Data—Automatic Centerlining (1) Without Centerlining

Referring again to FIG. 7, after the shape point generation program 400 has evaluated all the fused data points and determined which of the fused smoothed data to use as proto-shape points, the proto-shape points can be used to form shape point data for the geographic database 100. In one embodiment, the proto-shape points determined by the shape point generation program 400 may be used directly as shape points in the geographic database 100 (Steps 470 and 472 in FIG. 7). To use the selected data points directly as shape points, a database updating program 474 (shown in FIG. 19) is used. The database updating program 474 may be installed on one of the computer workstations 121 located at the field office 118 (as shown in FIG. 1). Alternatively, the database updating program 474 may be installed on another computer, such as the portable computer 308 used to collect data while driving along roads. The computer upon which the database updating program 474 is installed includes the appropriate hardware and software so that it can be connected to the network 124 in order to exchange data with the main computer 116. The computer upon which the database updating program 474 is installed has access to the fused smoothed shape point data that has been selected as proto-shape point data. The database updating program 474 may be similar to the program described in the copending patent application entitled "Method and System for Collecting Data for Updating a Geographic Database," Ser. No. 09/256,389, filed Feb. 24, 1999, the entire disclosure of which is incorporated by reference herein.

The database updating program 474 provides for adding, modifying, and deleting records in the main copy 100 of the geographic database. If the proto-shape points relate to roads that are not already represented in the geographic database, the database updating program 474 provides for creating new data records that are stored in the main copy 100 of the geographic database to represent these roads. The proto-shape point data are added as shape point data in the new records formed to represent these roads in the main copy 100 of the database. If the proto-shape points relate to roads that are already represented by data records in the main copy 100 of the geographic database, the database updating program 474 provides for modifying the existing data records in the main copy 100. The existing records are modified to add the proto-shape point data as shape point data. These modifications are performed on the primary copy of the geographic database over the network 124.

(2) With Centerlining

In a preferred embodiment, the proto-shape points determined by the automatic shape point generation program 400 are modified prior to being added as shape point data in the main copy 100 of the geographic database. According to this embodiment, the proto-shape points determined by the automatic shape point generation program 400 are modified by adjusting them to coincide with the centerline of the represented road (Steps 470 and 498 in FIG. 7). This process 498 may performed be by an automatic centerlining program 500. The automatic centerlining program 500 modifies the coordinates of the proto-shape points to take into account the position of the vehicle as the raw sensor data were being collected. As mentioned above, when the vehicle is being driven to collect data (Steps 302 and 312 in FIG. 7), it is driven in a consistent, known position on the road. As stated above, the vehicle 304 is preferably driven in the rightmost lane. Because the vehicle was driven in the rightmost lane when the raw sensor data were being acquired, the smoothed fused data (derived therefrom) represent the position of the rightmost lane. However, as mentioned above in connection with FIGS. 4–6, when shape point data are stored to represent a shape of a road, the shape point data correspond to positions along the centerline of the represented road (or the centerline of the lanes in one direction of a road represented by separate sets of shape points for each direction). Thus, when road position data are collected by the vehicle traveling along a road, the collected data does not correspond to the way that the road is represented in the geographic database.

To account for this difference, the automatic centerlining program 500 modifies the proto-shape point data. More specifically, the automatic centerlining program 500 calculates new coordinates using the for each of the proto-shape points thereby shifting the points to take into account the position of the vehicle as the raw sensor data were being collected. In this process, The component steps of one embodiment of the automatic centerlining program are shown in FIG. 19.

Figure 19:
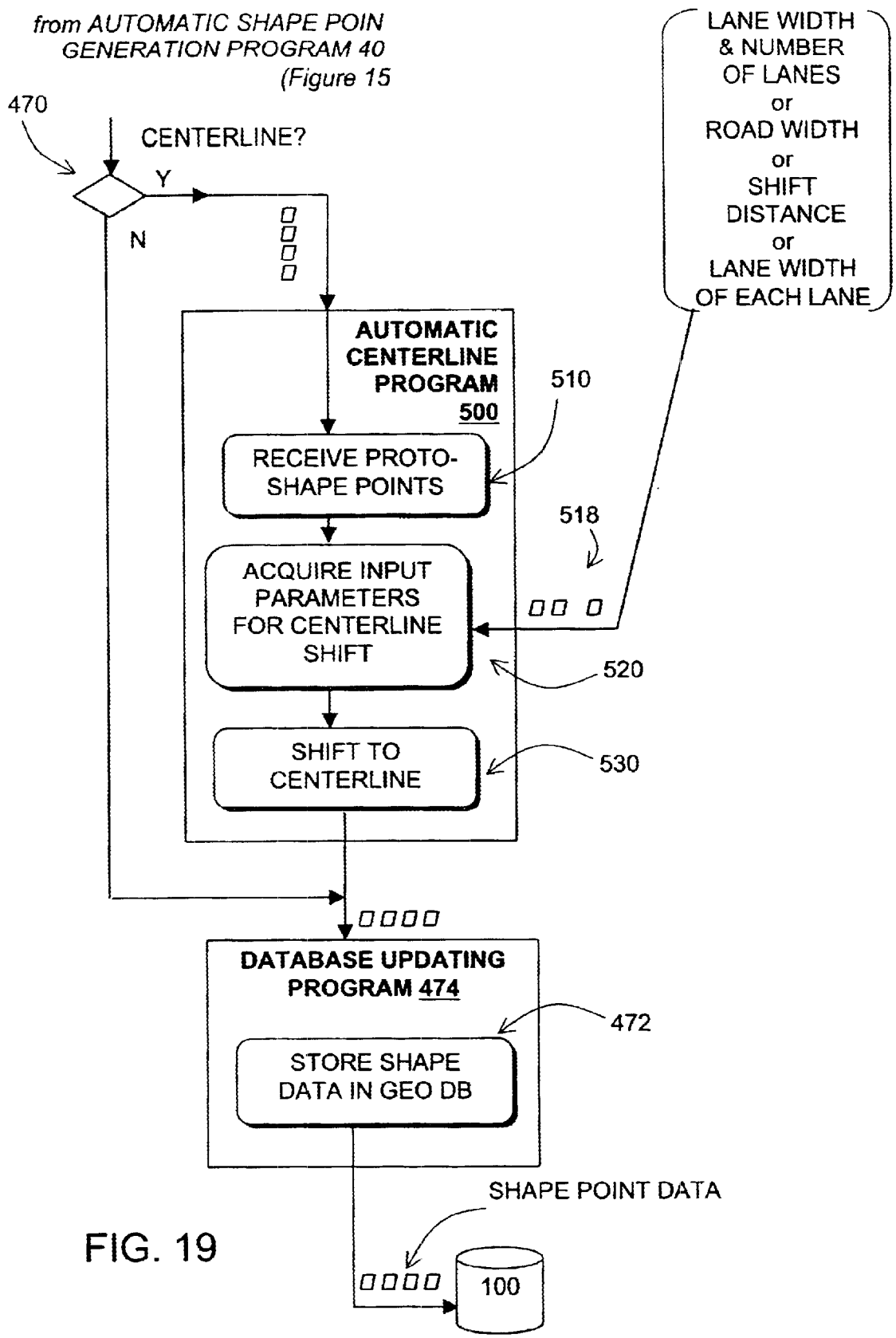
FIG. 19 is a flow diagram of the steps in a portion of the process shown in FIG. 7 for automatically adjusting the selected data shape point to account for the vehicle location while collecting data.

Referring to FIG. 19, an initial step performed by the automatic centerlining program 500 is to receive the proto-shape points as input (Step 510). The automatic centerlining program 500 can be operated in several different modes. In one mode, input parameters 518 are provided to specify the shift distance. These input parameters 518 may be may provided in several different ways.

One way to provide these input parameters 518 is to have the researcher specify the number of lanes and the lane width. The automatic centerlining program may include a menu for this purpose. This approach may be selected when all the lanes are known to have the width or when all the lanes are estimated to have the same width. Based upon specification of the number of lanes and the lane width, a shift distance is determined. The shift distance is equal to the width of each lane times the number of lanes divided by two, minus one half the lane width. For example, for a four lane road in which each lane is 8 feet in width, the shift distance would be 12 feet. If the road has a median, half the width of the median would be added to the shifted distance. Note that for roads that are represented by separate sets of shape points (such as the road 211 illustrated in FIG. 6), the number of lanes would include only those lanes located on one side of the median.

A second way to provide these input parameters 518 is to have the researcher specify a lane width for each lane. This approach may be selected when the researcher knows the width of each lane. Based upon the specification of the lane width for each lane, a shift distance is determined. The shift distance would be equal to the sum of all the lane widths divided by two, minus one half the width of the rightmost lane. If the road is a median, half the width of the median would be added to the shift distance. Still another way to provide input parameters 518 is to specify a shift distance. If a shift distance is provided as an input, this distance is used instead of calculating a shift distance, as described above.

According to another mode of operation of the automatic centerlining program 500, the shift distance may be determined automatically. In order to operate in this mode, information about the road, such as the number of lanes and width of each lane need to have already been stored as attributes of the road. Using the values of these attributes, a centerline shift can be calculated using the formula described above.

Using the input parameters 518, new coordinates are determined for each of the proto-shape points (Steps 530). The coordinates of the new point determined for each proto-shape point are calculated so that the new point coincides with the centerline of the represented road. When determining the coordinates of the new point, the curvature of the road is taken into account. According to one embodiment, a tangent of the curvature is approximated at each proto-shape point. The tangent at a proto-shape point may be approximated by determining a straight line between the proto-shape point and that proto-shape point located immediately before the proto-shape point. After the tangent is approximated, a line normal to the tangent is determined through the proto-shape point. The new data point is located along this normal line. Specifically, the new data point is located at the centerline shift distance from the proto-shape point along the normal line. The direction at which the new data point is location along the normal line from the proto-shape point is determined taking into account the direction of travel of the vehicle (which can be determined by the order in which the raw sensor points were acquired). Using the direction of vehicle travel, the new data point is located in the left direction (relative to the vehicle direction of travel) along the normal line (for countries in which traffic travels on the right sides of roads). These steps are illustrated in FIGS. 20A–20D.

Figure 20A:
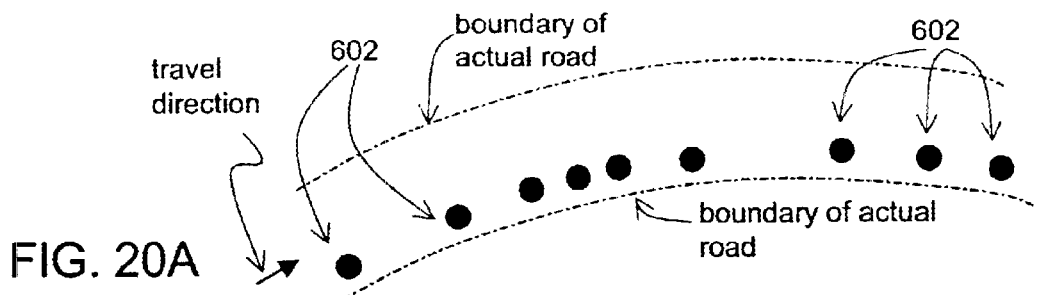
FIGS. 20A–20D show application of the process of FIG. 19 to automatically centerline shape points for a geographic database.
Figure 20B:
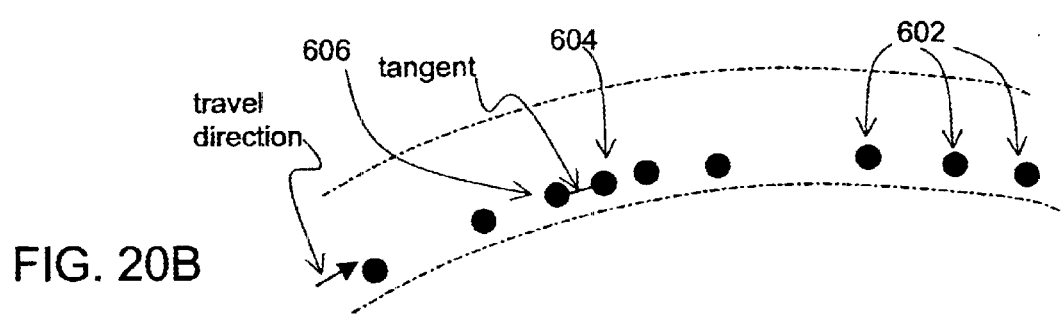
Figure 20C:
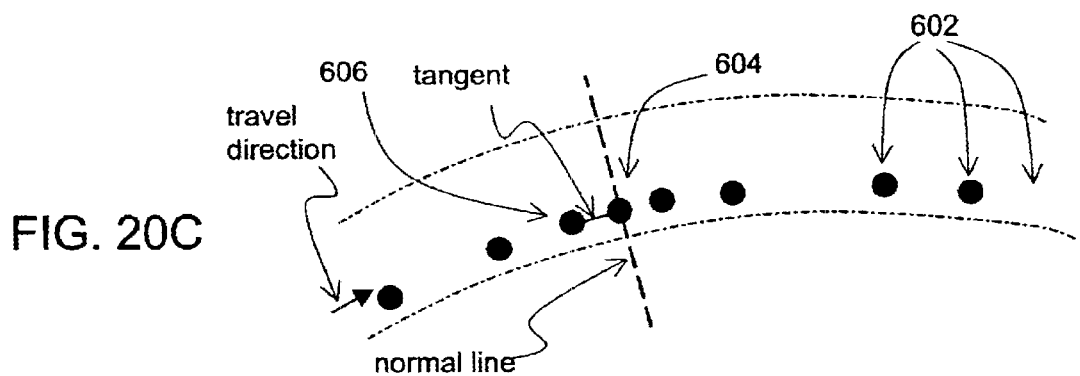
Figure 20D:
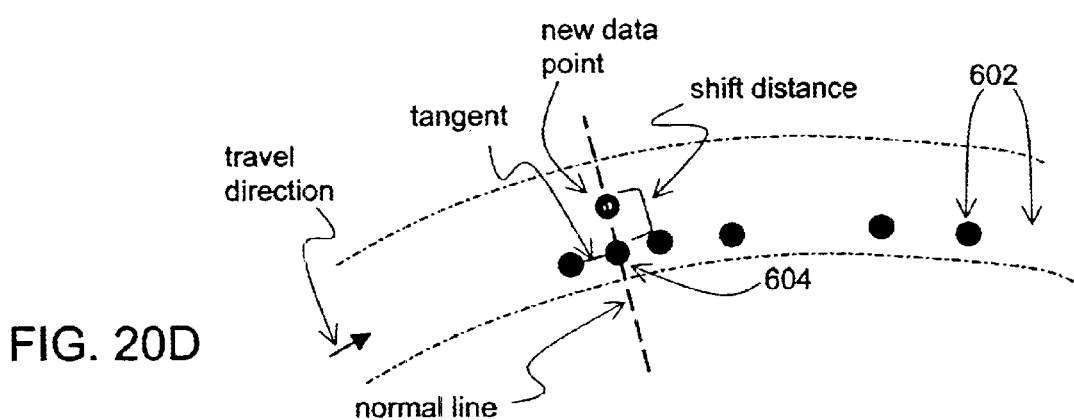

In FIG. 20A, a series of proto-shape points 602 is shown. Also shown is an outline of the road along which the raw sensor data were acquired and from which the proto-shape points were derived. The automatic centerlining program 500 evaluates each proto-shape point one at a time and determines a new data point. For example, starting with the proto-shape point labeled 604, a tangent of the curvature at the point is approximated, as shown in FIG. 20B. The tangent is approximately by determining a straight line between the proto-shape point 604 and the proto-shape point located immediately prior thereto. This prior proto-shape point is labeled 606. Then, a line normal to the tangent at the proto-shape point 604 is determined, as shown in FIG. 20C. Using the shift distance (which is either input or derived from the attributes of the road), the coordinates of a new data point are determined at the shift distance from the coordinates of the proto-shape point along the normal line, as shown in FIG. 20D. The coordinates of the new data point are stored. The automatic centerlining program then evaluates the next proto-shape point in order to determine a new data point and so on until new data points are determined for each of the proto-shape points.

Referring to again to FIG. 19, after all the new data points which are determined by the automatic centerlining program 500, these new data points are provided to the database updating program 474. The new data points are stored as shape points in the primary copy 100 of the geographic database by the database updating program 474 in the manner described above.

Alternative embodiment of the automatic centerlining program

An alternative process for the centerline shifting step 530 of the automatic centerlining program are shown in FIGS. 21A–21D. Like the steps described in connection with FIGS. 20A–20D, the steps shown in FIGS. 21A–21D determine new data points for each of the proto-shape points. According to the embodiment shown in FIGS. 21A–21D, a curvature of the road is determined at each proto-shape point. The curvature at each proto-shape point may be determined in several different ways. One way to determine the curvature at the location of a proto-shape point is to calculate the curvature taking into account the one or more proto-shape points that are located before and after the proto-shape point. Alternatively, the automatic shape point generation program may use the value of the curvature data acquired by the sensors (e.g., the inertial sensors 308 in FIG. 8) which is associated with the proto-shape point data for that point if available. A radial line is determined through the center of the curve corresponding to the curvature and the proto-shape point. The new data point is located along this radial line. Specifically, the new data point is located at the centerline shift distance from the proto-shape point along the radial line. As in the previously described embodiment, the direction at which the new data point is located along the radial line from the proto-shape point is determined taking into account the direction of travel of the vehicle. Using the direction of vehicle travel, the new data point is located in the left direction (relative to the vehicle direction of travel) along the radial line (for countries in which traffic travels on the right sides of roads). These steps are illustrated in FIGS. 21A–21D.

Figure 21A:
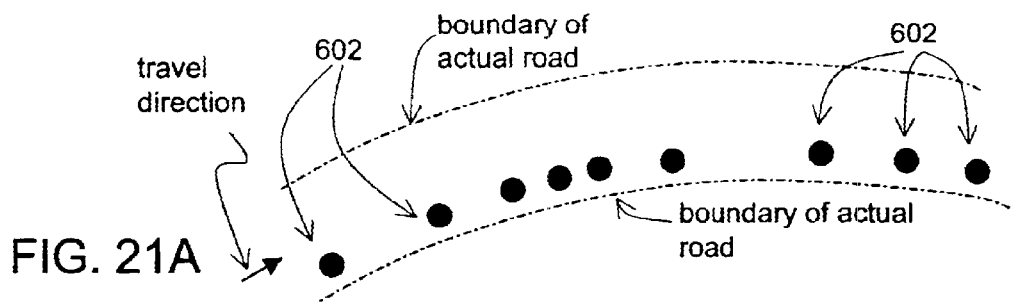
FIGS. 21A–21D show an alternative process for automatically centerlining shape points for a geographic database.
Figure 21B:
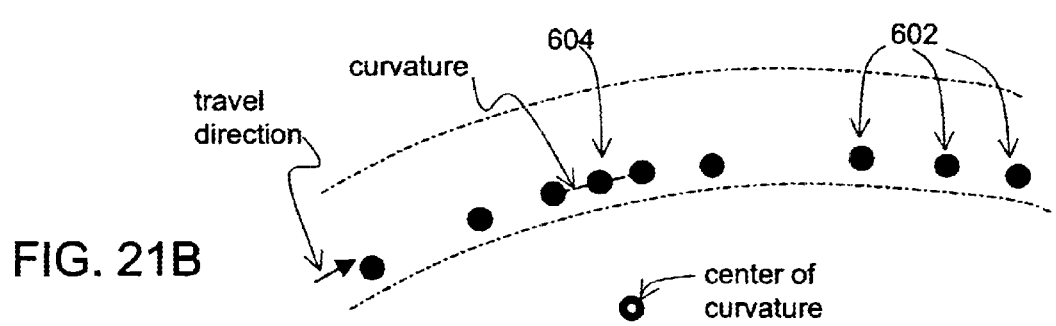
Figure 21C:
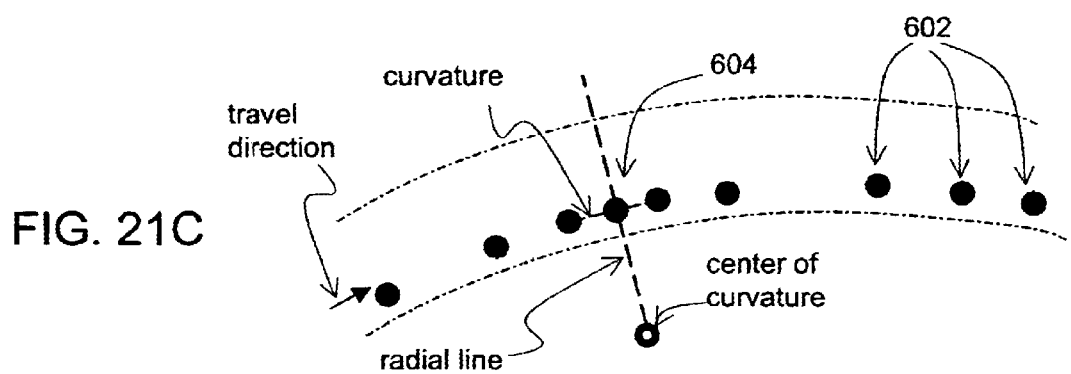
Figure 21D:
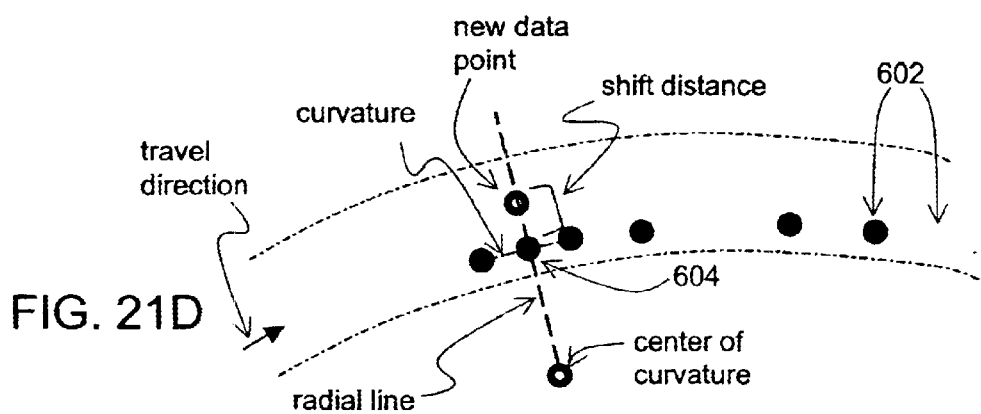

In FIG. 21A, the series of proto-shape points 602 from FIG. 20A is shown. As in the previous embodiment, the automatic centerlining program 500 evaluates each proto-shape point one at a time and determines a new data point. For example, starting with the proto-shape point labeled 604, a curvature at the point is determined, as explained above. The curvature is illustrated in FIG. 21B. Then, a radial line through this curve is determined, as shown in FIG. 21C. Using the shift distance (which is either input or derived from the attributes of the road), a new data point is determined at the shift distance from the proto-shape point along the radial line, as shown in FIG. 21D. The coordinates of the new data point are stored. The automatic centerlining program then evaluates the next proto-shape point in order to determine a new data point and so on until new data points are determined for each of the proto-shape points.

V. ALTERNATIVE EMBODIMENTS

A. Centerline First Embodiment

In the first embodiment described above, proto-shape points are determined from the fused raw data points and then, after the proto-shape points are determined, the shape points are determined by calculating new data points at locations that are shifted to the centerline from the positions of the proto-shape points. In an alternative embodiment, these steps can be reversed. According to this alternative embodiment, the fused raw points are shifted to the centerline first. Then, these data points, which are now located along the centerline of the represented road, are evaluated using the shape point generation program 400 in order to determine which of these points to discard and which of these points to use as shape points in the primary copy of the geographic database.

B. Acquire Data from Both Sides of Road

In the first embodiment described above, raw sensor points are acquired driving along only one side of the road. Driving along only one side of the road to acquire road position data may be preferable because it is more efficient. However, in an alternative embodiment, vehicle position data can be acquired driving in both directions along the road. If vehicle position data are acquired driving in both directions along the road, a centerline can be determined by calculating a line halfway between the vehicle paths in each direction. If vehicle position data are acquired driving in both directions, the fused raw data for each direction may be shifted to the centerline first. These fused raw data may be very dense because they represent data acquired in both directions. These fused raw sensor data that are shifted to the centerline may be evaluated using the shape point generation program 400 to determine which of the data to discard and which of the data to use as shape point data.

C. Producing Derived Database Products of Lower Accuracy Levels

In the first embodiment described above, the automatic shape point generation program may be used to generate shape points for a database of any specified accuracy. For example, a high level of accuracy may be specified, such as 1 meter. After shape point data for the primary copy of the geographic database are stored with this accuracy level, a derived database product (such as one of the products 110 in FIG. 2) can be produced. This derived database product can be used in an application that requires the high level of accuracy, such as obstacle warning and avoidance, curve warning, advanced cruise control, headlight aiming, and so on. If a derived database product having a lower level of accuracy (e.g., 10 meters) would suffice for a different kind of application (such as Internet map displays), a derived database product having a lower level of accuracy can be formed from a primary copy having a higher level of accuracy. In order to form a derived database product of a lower accuracy from a primary copy that has a high level of accuracy, the automatic shape point generation program 500 can be run using the shape point data in the primary copy as input. When the automatic shape point generation program is run with the primary copy as input, a level of accuracy is specified which is lower than the level of accuracy of the primary copy. For example, if the primary copy was formed with a level of accuracy of 1 meter, a lower level of accuracy would be specified to the automatic shape point generation when it is run using the shape point data in the primary copy as input. When run in this manner, the automatic shape point generation program treats the actual shape point data as if it were fused raw sensor data. The automatic shape point generation program would discard those shape points that are not needed to provide the lower level of accuracy. According to this embodiment, it would be preferable to form the primary copy with the highest level of accuracy that would be expected to be needed, and then specify lower levels of accuracy for each derived database product.

D. Alternative Method of Production of Derived Database Products of Lower Accuracy Levels An alternative to the foregoing embodiment would be to form multiple versions of the primary copy of the geographic database from the fused raw data. According to this alternative, instead of applying the automatic shape point generation program to the data in the primary copy in order to form derived database products of lower levels of accuracy, separate versions of primary copies would be prepared from the raw fused sensor data for different applications. This alternative has the advantage that the raw fused sensor data are used to form primary copies of databases of a desired level of accuracy for each specific application.

E. Collection by End Users

In the embodiments described above, it was stated that road position data were collected by a researcher driving a vehicle in which a positioning system was installed along roads in a geographic area. In an alternative embodiment, the road position data may be collected by someone other than a researcher. For example, a positioning system that collects road position data may be installed in a vehicle which is used and driven by an end user. The end user may be a commercial user (e.g., a taxi cab driver or a delivery truck driver) or alternatively, the end user may be a non-commercial user. According to this alternative, a data storage system operates to collect the vehicle position data as the vehicle is being driven along roads, in the same manner as in the embodiment described above in which the researcher was driving the vehicle. The data storage system may be located in the vehicle or may be located remotely. If the data storage system is located remotely, the vehicle position data are transmitted by a wireless communication system to the remote location at which the data storage system is located.

In this embodiment, once the vehicle position data are acquired, they are processed into shape point data in the same manner as described above. When vehicle position data are acquired by an end user, a verification process may be used to check the validity of the data (for example, to check whether the end user's vehicle may have left the road). When road position data are acquired by end users, a statistical analysis process may be used to refine the data. A method for acquiring road position data using end users' vehicles is described in copending application Ser. No. 08/951,767, the entire disclosure of which is incorporated herein by reference.

F. Collection of Other Types of Data

The embodiments of the data collection systems described above can be used to collect data relating to the positions of roads in a geographic area. According to one embodiment, while a researcher is driving a vehicle along a road to collect data relating to the positions of roads, the research may also be obtaining data relating to other road attributes. These other road attributes include signage (e.g., signs along the road), speed limits, addresses and address ranges, street names, number of lanes, turn signals, lane dividers, road surface composition, stop lights, stop signs, etc. Embodiments of systems and methods for collection some of these kinds of road attributes are described in applications, Ser. Nos. 09/256,389 and 09/335,122, the entire disclosures of which are incorporated by reference herein.

G. Various Other Alternatives

In one embodiment, the data acquisition program 310, the automatic shape point generation program and the automatic centerlining program are written in the C programming language. In alternative embodiments other programming languages may be used, such as C++, Java, Visual Basic, and so on.

In the first embodiment described above, the raw sensor data were fused and smoothed using a least-squares fitted to a cubic equation. In alternative embodiments, other types of smoothing and filtering techniques may be used. In yet another alternative, no filtering of the raw sensor data may be performed.

In the first embodiment, both automatic shape point generation and automatic centerlining were performed to produce shape point data from the fused sensor data. In alternative embodiments, the automatic centerlining program can be used without the automatic shape point generation program. For example, the output of the automatic shape point generation program can be stored as shape point data in the primary copy of the database without shifting the data points to the centerline. Alternatively, the data points determined by the automatic shape point generation program can be shifted to centerline positions by a means other than the automatic centerline program.

Likewise, the automatic shape point generation program can be used without the automatic centerlining program. For example, the automatic centerlining program can be used on the raw sensor data points without having the automatic shape point generation program process the raw sensor data points first. These raw sensor points—now aligned on the centerline of the road segment—can be stored as shape points. Alternatively, the automatic centerlining program can be used on shape point data that had not been processed by the automatic shape point generation program.

In the first embodiment described above, a method for automatic generation of shape points was disclosed that identifies those raw data points necessary to include as shape points in a geographic database in order to provide a desired level of accuracy. Various other methods can be used to evaluate these raw data points and the automatic shape point generation program can employ other algorithms or techniques for this purpose.

In a present embodiment, the shapes of other-than-straight road segments are represented by shape point data that include data indicating the geographic coordinates of one or more points along the road segment located between its endpoints, and which additionally may include other data, such as data indicating the curvature of the represented road segment at the locations of the points, data indicating the road grade at the location of the points, etc. In addition to these kinds of data, there are other ways to represent other-than-straight road segments. Some of these other ways to represent other-than-straight roads include splines (including Bezier curves), clothoids, etc. One way to implement a representation of an other-than-straight road segment is disclosed in Ser. No. 08/979,211, filed Nov. 26, 1997, the entire disclosure of which is incorporated by reference herein. Embodiments of the automatic shape point generation program, disclosed above, can be used with any of these other kinds of representations. Likewise, embodiments of the automatic centerlining program, disclosed above, can be used with any of these other kinds of representations.

In the shape point evaluation algorithm described above, it was stated that the point selected as the starting point for evaluation by the shape point generation algorithm was the point that coincides with the node at an endpoint of the road segment. In alternative embodiments, the shape point evaluation algorithm can start at any point including any point located between the end points of a segment.

In some of the embodiments of the shape point evaluation algorithm described above, it was stated that intermediate fused data points were evaluated by determining the distance of each intermediate fused data point to a straight line connecting the fused data points on either side of the intermediate points and then comparing these distances to a threshold distance. In an alternative embodiment, instead of comparing the distance of each intermediate point to a threshold distance, the curvature at each successive point can be compared to a percentage threshold, e.g., ±10%, of the curvature of a prior point. If the curvature at a successive point is outside the percentage threshold of the curvature of the prior point, the curvature of the prior point no longer sufficiently describes the shape of the path and a proto-shape point is selected, as described in connection with the prior embodiments. With this alternative embodiment, the proto-shape points are selected so that the difference in curvature between any two adjacent proto-shape points does not exceed the selected percentage threshold.

As mentioned above, a camera may be located in the vehicle and operated to collect images around the vehicle as the vehicle is being driven along the roads to collect position and curvature data. The images from the camera may be used for various purposes. For example, the images from the camera may be used in conjunction with the automatic centerlining program to determine the centerline shift distance. In another example, images from the camera may be used to correct the shape point location to account for deviations by the vehicle from the center of the rightmost lane, e.g., to avoid an obstacle or to make a turn.

VI. ADVANTAGES

The present system and method provide for collecting data for a geographic data efficiently and quickly. The disclosed systems and methods provide for the consistent and accurate determination of road position data for a geographic database. The disclosed systems and methods take advantage of the high levels of accuracy that can be provided by the sensor equipment and ensure that the high levels of accuracy are maintained in the geographic data derived from this sensor equipment.

An advantage associated with the disclosed embodiments is that the high accuracy that can be obtained at the sensor level is maintained in the database product formed therefrom while relying on software programs that automatically adjust road geometries and automatically generate shape and curvature.

The present system and method provide for the production of various database products each with a level of accuracy tailored to the application for which the specific product will be used. As mentioned above in connection with FIG. 2, various different kinds of database products 110 may be produced using the master copy 100 of the geographic database. Each of these different database products 110 may include shape point data (e.g., shape point data 222(3) described in connection with FIG. 5), in order to represent the shapes of other than straight roads. However, the number of shape points needed by each of these different database products to represent other than straight roads may be different. These differing needs result from the different purposes for which each of these different database products is used. Some database products are used in applications that require greater accuracy, and therefore, such database products may require a greater number of shape points to more accurately represent other-than-straight roads. On the other hand, other database products are used in applications that require less accuracy, and therefore these database products may require a lesser number of shape points to represent other-than-straight roads. For an application that requires lesser accuracy, there may be advantages to having fewer shape point data in the database product used by the application. If fewer shape point data are included, the storage capacity requirements in the database are decreased. In addition, if fewer shape point data are included, an application using the database may run faster.

The foregoing advantages relate to database products (110 in FIG. 2) that are derived from the master copy 100 of the geographic database. With respect to the master copy of the geographic database 100, similar considerations apply. Although all the smoothed fused data could be stored as shape point data in the master copy 100 of the geographic database, this would cause the size of the database to be very large. The large size of such a database may result in difficulties in handling, managing, updating, and maintenance. Accordingly, it is an advantage that only a portion of the smoothed fused data are stored as shape point data in the master copy of the geographic database.

It is intended that the foregoing detailed description be regarded as illustrative rather than limiting and that it is understood that the following claims including all equivalents are intended to define the scope of the invention.

We claim:

1. A method of storing data in a geographic database to represent road shape comprising the steps of:

obtaining source data that represent a plurality of points along roads;

determining which of said plurality of points are necessary to represent the roads with a desired level of accuracy; and storing in said geographic database data to represent those points determined to be necessary, wherein said step of determining is based upon an evaluation of said plurality of points such that a straight line connecting any two adjacent necessary points is not farther from any of said plurality of points located between said two adjacent necessary points than a distance associated with said level of accuracy away.

2. A method of storing data in a geographic database to represent road shape comprising the steps of:

obtaining source data that represent a plurality of points along roads;

determining which of said plurality of points are necessary to represent the roads with a desired level of accuracy; and storing in said geographic database data to represent those points determined to be necessary, wherein said step of determining is based upon an evaluation of said plurality of points such that each point determined not to be necessary is located less than a distance associated with said level of accuracy away from a straight line that connects the closest necessary points on either side of said point determined not be necessary.

3. A method of making geographic database products comprising the steps of:

obtaining source data that represent a plurality of points along roads;

determining which of said source data are necessary to represent said roads with a level of accuracy corresponding to a highest level of accuracy required for a derived database product;

storing in a master geographic database those source data determined to be necessary to represent said roads with at least said highest level of accuracy;

forming the first derived database product with the source data contained in said master geographic database;

determining which of said source data are necessary to represent said roads with a level of accuracy that is lower than the highest level; and forming a second derived database product from the source data determined to be necessary to represent said roads with said level of accuracy that is lower than the highest level.

4. The method of claim 3 wherein said highest level of accuracy is specified to be a value less than approximately 1 meter.

5. The method of claim 3 wherein said highest level of accuracy is specified to be a value between approximately 3 and 5 meters.

6. The method of claim 3 wherein said highest level of accuracy is specified to be a value between approximately 1 and 3 meters.

7. The method of claim 3 wherein said source data comprise raw sensor data.

8. The method of claim 3 wherein said source data comprise raw sensor data formed as a result of a fusing step in which each raw sensor reading is modified to take into account sensor readings from a plurality of different types of sensors.

9. The method of claim 3 wherein said source data are acquired while driving a vehicle along said roads.

10. The method of claim 3 wherein said source data are acquired using an inertial sensor system and a GPS system.

11. The method of claim 3 further comprising the step of:

modifying those data that represent a plurality of points along roads to align with centerlines of the roads represented thereby.

12. The method of claim 11 wherein said step of modifying is performed after said step of determining.

13. The method of claim 3 wherein said second derived database product is formed from the source data contained in said master geographic database.

14. A method of making geographic database products comprising the steps of:

obtaining source data that represent a plurality of points along roads;

determining which of said source data are necessary to represent said roads with a specified planar level of accuracy and a specified vertical level of accuracy; and storing in a master geographic database those source data determined to be necessary to represent said roads with said specified planar level of accuracy and said specified vertical level of accuracy.

15. The method of claim 14 wherein said source data are acquired using a data collection system installed in a vehicle that is driven along said roads.

16. A geographic database stored on a computer readable medium formed according to the process of claim 3 or 14.

17. The method of claim 14 wherein said specified planar level of accuracy is different from said specified vertical level of accuracy.

* * * * *